United States Patent
Yamaguchi

(10) Patent No.: US 8,380,360 B2
(45) Date of Patent: Feb. 19, 2013

(54) TEMPERATURE CONTROL METHOD, METHOD OF OBTAINING A TEMPERATURE CORRECTION VALUE, METHOD OF MANUFACTURING A SEMICONDUCTOR DEVICE AND SUBSTRATE TREATMENT APPARATUS

(75) Inventor: Hideto Yamaguchi, Imizu (JP)

(73) Assignee: Hitachi Kokusai Electric Inc., Chiyoda-Ku, Tokyo (JP)

( * ) Notice: Subject to any disclaimer, the term of this patent is extended or adjusted under 35 U.S.C. 154(b) by 984 days.

(21) Appl. No.: 12/232,007

(22) Filed: Sep. 9, 2008

(65) Prior Publication Data
US 2009/0105867 A1   Apr. 23, 2009

(30) Foreign Application Priority Data

Oct. 19, 2007 (JP) ................................. 2007-272029
Jul. 18, 2008 (JP) ................................. 2008-187631

(51) Int. Cl.
*G05D 23/00* (2006.01)
(52) U.S. Cl. ........................... 700/299; 110/190; 438/54
(58) Field of Classification Search .................. 700/174, 700/299, 121; 110/185–190; 438/54–55; 118/666, 724, 166
See application file for complete search history.

(56) References Cited

U.S. PATENT DOCUMENTS

| 5,603,772 A * | 2/1997 | Ide ................................. 118/724 |
| 6,496,749 B1 * | 12/2002 | Yamaguchi et al. .......... 700/121 |
| 6,746,908 B2 | 6/2004 | Tanaka et al. |
| 2003/0121905 A1 * | 7/2003 | Nanno et al. .................. 219/494 |
| 2006/0188240 A1 * | 8/2006 | Tanaka et al. ................. 392/416 |

FOREIGN PATENT DOCUMENTS

| JP | 3834216 | 7/2006 |
| KR | 2007-0077509 A | 7/2007 |

OTHER PUBLICATIONS

Notice of Reason(s) for Rejection dated Oct. 19, 2010, with English translation.

* cited by examiner

*Primary Examiner* — Ryan A. Jarrett
*Assistant Examiner* — Chad Rapp
(74) *Attorney, Agent, or Firm* — McGinn IP Law Group, PLLC

(57) ABSTRACT

In a temperature control method in which a target temperature is given in a thermal treatment furnace and plural heaters are controlled according to the target temperature, the correlation of the each heater and plural profile temperature sensors provided in the thermal treatment furnace is determined, a virtual temperature is calculated on the basis of the detection temperature of each profile temperature sensor and a weighting factor calculated from the correlation, and the each heater is controlled so that the virtual temperature is coincident with the target temperature.

14 Claims, 7 Drawing Sheets

TEMPERATURE CONTROL METHOD, METHOD OF OBTAINING A TEMPERATURE CORRECTION VALUE, METHOD OF MANUFACTURING A SEMICONDUCTOR DEVICE AND SUBSTRATE TREATMENT APPARATUS

BACKGROUND OF THE INVENTION

1. Field of the Invention

The present invention relates to a temperature control method for a semiconductor manufacturing apparatus, etc., and particularly to a temperature control method of controlling the temperature of a treatment target according to a target temperature by using as a heating unit as a heater which is divided into plural heating zones.

2. Description of the Related Art

A vertical type furnace has been practically used as a batch type thermal treatment apparatus for performing a thermal treatment such as oxidation, diffusion, CVD, etc. on many semiconductor wafers from the viewpoint that suction of air into a reaction tube during a wafer input or takeout operation is little and thus the growth of natural oxidation film can be suppressed.

The batch type thermal treatment apparatus such as the vertical type furnace or the like has been used while segmentalized into various thermal treatment steps in accordance with the type of each thermal treatment, the type of film, the electrical characteristic expected to the film type or the like. In each of the segmentalized thermal steps, the temperature, the gas flow rate, the pressure, etc. which are strictly set in connection with each step so that a thermally-treated semiconductor wafer has an expected performance. Accordingly, from the viewpoint of the temperature control function, the thermal treatment apparatus has been required as one of important functions that uniform and high-precision temperature control is performed on all treatment targets in the thermal treatment process while the temperature which is set to various values is set as a target temperature.

From this point of view, the temperature control is required in the thermal treatment furnace so that the temperature of the treatment target in the thermal treatment process is coincident with a given target temperature to the utmost extent.

The existing vertical type thermal treatment furnace will be described hereunder with reference to FIG. 5. FIG. 5 is a longitudinally-sectional view showing the construction of the thermal treatment furnace 1.

The thermal treatment furnace 1 has a cylindrical heater 2, and supported by a heater base 3 so as to be vertically disposed. A reaction tube 4 and an inner tube 5 are disposed inside the heater 2 so as to be concentric with the heater 2. The reaction tube 4 is formed of quartz, for example, and designed in such a cylindrical shape that the inner diameter thereof is larger than the outer diameter of the inner tube 5, the upper end thereof is closed and the lower end thereof is opened. The inner tube 5 is formed of quartz, for example, and designed in such a cylindrical shape that the upper and lower ends thereof are opened. The inner tube 5 is disposed inside the reaction tube 4, and semiconductor wafers (hereinafter referred to as "treatment substrates") as thermal treatment targets are accommodated in the cylindrical hollow portion of the inner tube 5 under the state that the treatment substrates are arranged in a horizontal position in a multistage style in the vertical direction by a boat 11.

A cylindrical flange 6 is concentrically disposed at the lower side of the reaction tube 4 so as to support the reaction tube 4 and the inner tube 5. Furthermore, an exhaust pipe 7 is mounted on the cylindrical flange 6 and intercommunicates with the lower end portion of a cylindrical space formed by the gap between the reaction tube 4 and the inner tube 5 so that gas in the reaction tube 4 can be discharged.

A cap 8 is provided below the cylindrical flange 6 so that the opening portion at the lower end of the cylindrical flange 6 is hermetically closed by the cap 8. The cap 8 is connected to an elevator (not shown). When the elevator moves downwardly, the boat 11 and the spacer 12 can be carried out from the inner tube 5, and when the elevator moves upwardly, the boat 11 and the spacer 12 can be carried into the inner tube 5. A hermetically sealed thermal treatment area 9 is formed by the reaction tube 4, the cylindrical flange 6 and the cap 8.

A gas introducing nozzle 10 is connected to the cap 8 so as to intercommunicate with the thermal treatment area 9, and introduces reaction gas into the thermal treatment area 9 according to a gas flow rate controller (not shown). The boat 11 is formed of quartz, for example, and keeps the treatment substrates in a horizontal position and in a tandem and multistage arrangement while the centers of the treatment substrates are aligned with one another. The boat 11 is mounted and supported on the cap 8 through a spacer 12.

In order to perform the temperature control on the heat treatment area 9 with higher precision, the heater 2 is divided into plural heating zones. In the case of FIG. 5, the heater 2 is divided into three zones. When it is necessary to individually show the heater 2 every zone, the heater 2 is represented by 20a, 20b and 20c in connection with the respective zones. Areas of the thermal treatment area 9 which are affected by the heat of the divided heaters are represented by a zone, b zone and c zone in connection with the heaters 20a, 20b, 20c as occasion demands. Power supply units 13a, 13b, 13c (represented as a power supply unit 13 when generically named) are connected to the heater 2. The power supply unit 13 supplies predetermined power to the heater 2 on the basis of an instruction value output from a temperature controller 14 described later.

In-furnace temperature sensors 21a, 21b, 21c (represented as an in-furnace temperature sensor 21 when named generically) are provided in the gap between the reaction tube 4 and the heater 2 so as to correspond to the heating zones, and the temperature in the reaction tube 4 is detected by these sensors (also called as the temperature of the a zone, the temperature of the b zone and the temperature of the c zone). The temperature controller 14 contains a control algorithm for making the detection temperature of the in-furnace temperature sensor 21 approach to a desired value, and it executes the control calculation on the basis of these data and outputs the calculation result to the power supply unit 13.

Next, a method of forming thin film on a treatment substrate with a CVD method as one style of the thermal treatment by using the thus-constructed thermal treatment furnace 1 will be described.

When plural treatment substrates are loaded into the boat 11 under the state that the boat 11 and the spacer 12 are located out of the thermal treatment area 9, the boat 11 is carried into the thermal treatment area 9 through the cap 8 and the spacer 12 by upward motion of the elevator (not shown).

Subsequently, the thermal treatment area 9 is heated by the heater 2 so as to be equal to a desired temperature. At this time, a target temperature is first set in the temperature controller 14. The temperature controller 14 carries out the control calculation on the basis of the detection temperature of the in-furnace temperature sensor 21 and the target temperature and outputs the calculation result to the power supply unit 13. The power supply unit 13 supplies current to the heater 2 so as to generate indicated heat. The detection of the temperature by the in-furnace temperature sensors 21, the control calculation of the temperature controller 14 and the heating current supply of the power supply unit 13 are repeated at a sufficiently short period, whereby the thermal treatment area 9 is temperature-controlled to be equal to the target temperature.

Subsequently, gas whose flow rate is controlled to a desired flow rate is introduced from a gas introducing nozzle 10 into the thermal treatment area 9. The introduced gas moves upwardly inside the inner tube 5, flows out from the opening at the upper end of the inner tube 5 into the cylindrical gap formed by the gap between the reaction tube 4 and the inner tube 5, and then discharged from the exhaust pipe 7. The gas comes into contact with the treatment substrates while passing through the thermal treatment area 9, and at this time thin film is formed on the treatment substrates by the CVD reaction.

When a preset treatment time elapses, the gas in the thermal treatment area 9 is replaced by inert gas, and also the temperature of the thermal treatment area 9 is reduced to such a sufficiently low temperature that the treatment substrates can be carried out. Thereafter, the boat 11 is carried out from the thermal treatment area 9 by downward motion of the elevator (not shown).

A thermocouple is normally used as the in-furnace temperature sensor 21. Therefore, in order to prevent metal pollution to the treatment substrates and occurrence of particles, the in-furnace temperature sensor 21 is disposed at the outside of the reaction tube 4 as shown in FIG. 5. Therefore, the in-furnace temperature sensor 21 cannot directly detect the temperature of the treatment substrates in the thermal treatment area 9. Therefore, this technique provides such a temperature system that the temperature of the treatment substrates in the thermal treatment area 9 is expected to be equal to a desired value by controlling the detection temperature of the in-furnace temperature sensor 21. However, there is an error between the temperature of the treatment substrates and the detection temperature of the in-furnace temperature sensor 21 when the thermal treatment is actually carried out. Accordingly, the thermal treatment is actually carried out at a temperature different from the target temperature with high probability, and thus the quality of the thermal treatment is lowered.

Under the background as described above, in order to perform temperature control of making the temperature of the treatment substrates approach to the target temperature as closely as possible, it may be considered that the temperature sensor is closer to the treatment substrates to perform the temperature control.

FIG. 6 shows a thermal furnace 1 in which a new temperature detecting unit (profile temperature sensor 15) is added to detect a temperature which is closer to the temperature of the treatment substrates than the detection temperature of the in-furnace temperature sensor 21. The profile temperature sensor 15 penetrates through the cap 8 and is disposed inside the inner tube 5 to detect the temperature closer to the treatment substrates. In order to implement the temperature control in the thermal treatment area 9 on the basis of the profile temperature sensor 15, the profile temperature sensor 15 is provided with detection points (sensors) whose number is equal to the division number of the heater, and the detection points (heaters) of the profile temperature sensor 15 are normally disposed at the same positions of the detection points of the in-furnace temperature sensor 21 in the long axis direction. In the example of FIG. 6, three detection points (sensors) (represented by 15a, 15b, 15c when they are individually handled), and the detected temperatures thereof are input to the temperature controller 14. The temperature controller 14 performs the temperature control so that the detection temperature of the profile temperature sensor 15 approaches the target temperature.

FIG. 7 is a diagram showing the position relationship of the heater 2, the in-furnace temperature sensor 21 and the profile temperature sensor 15 by extracting these elements from FIG. 6, and also shows an example of a temperature distribution in the long-axis direction in the thermal treatment area 9.

In FIG. 7, Ta, Tb, Tc represent the detection temperatures of the profile temperature sensors 15a, 15b, 15c. The detection temperatures of the profile temperature sensors 15 are substantially coincident with target temperature Y if the control algorithm of the temperature controller 14 is proper.

In the example of FIG. 7, the temperature at the intermediate position between Ta and Tb or the temperature at the intermediate position between Tb and Tc does not reach the target temperature Y. In this case, there is a case where in order to make the overall thermal treatment area 9 uniformly approach the target temperature, it is better not to make Ta, Tb, Tc approach the target temperature Y, but to make Ta, Tb, Tc approach temperature which is slightly higher than the target temperature. However, conversely to this case, there is a case where the temperature at the intermediate point exceeds the target temperature, and thus the above countermeasure is insufficient.

Therefore, a thermal treatment furnace 1 as shown in FIG. 1 may be used to grasp the temperature distribution in more detail in place of the provision of the profile temperature sensors 15 whose number is equal to the division number of the heater 2.

In FIG. 1, in order to detect the temperature distribution in the thermal treatment area 9 in detail, the profile temperature sensor 15 is provided with detection points (sensors) whose number exceed the division number of the heater, and arranged so as to cover the area where the treatment substrates exist. In the example of FIG. 1, eight sensors (represented like a profile temperature sensor 15-1 if it is necessary to individually represent each profile temperature sensor), and the detected temperature is input to the temperature controller 14.

Japanese patent No. 3834216 discloses, as a technique related to the present invention, a temperature control method which controls a heating device having at least two heating zones so that the detection temperature is set to target temperature at a predetermined position and in which temperature is detected at positions whose number is larger than the number of heating zones so that temperature at one predetermined position is detected in each heating zone and the heating device is controlled so that the difference between the target temperature and the detection temperatures at the plural predetermined positions is reduced. According to this patent, the correlation between a cascade thermocouple corresponding to the in-furnace temperature sensor 21 of the above invention and a well having a thermocouple or a profile thermocouple corresponding to the profile temperature sensor of the above invention is determined in advance, and the cascade thermocouple is controlled on the basis of the determined correlation so as to achieve the target temperature.

In the above technique, temperature is detected at many detection points (predetermined positions). However, when the temperature control is performed, one point of the profile temperature sensors 15 set at the respective detection points is selected for each zone (or the in-furnace temperature sensor 3) and the detection temperature thereof is controlled.

This will be described in detail with reference to FIG. 2. FIG. 2 is a diagram showing the positional relationship of the heater 2, the in-furnace temperature sensor 21 and the profile temperature sensor 15 which is clarified by extracting these elements from FIG. 1, and the detection points of the profile temperature sensor 15 are clarified by using 15-1 to 15-8. In FIG. 2, the control is performed in the related technique by adopting the detection temperature of the profile temperature sensor 15-1 located at the position nearest to the in-furnace temperature sensor 21a, the detection temperature of the profile temperature sensor 15-5 located at the position nearest to the in-furnace temperature sensor 21b and the detection temperature of the profile sensor 15-7 nearest to the in-furnace temperature sensor 21c out of the eight profile temperature sensors 15 in place of the detection temperature of the in-furnace temperature sensor 21a, the detection temperature of the in-furnace temperature sensor 21b and the detection temperature of the in-furnace temperature sensor 21c, respectively.

SUMMARY OF THE INVENTION

The present invention has been implemented in view of the foregoing situation, and has an object to provide a temperature control method, a method of obtaining a temperature correction value, a method of manufacturing a semiconductor device and a substrate treatment apparatus in which when there are detection units whose number exceeds the division number of a heater, the detection temperatures detected from the detection units are effectively used.

In order to attain the above object, according to a first aspect of the present invention, a temperature control method in which a target temperature is given in a thermal treatment furnace and plural heaters are controlled according to the target temperature comprises: determining the correlation of the each heater and plural profile temperature sensors provided in the thermal treatment furnace; calculating a virtual temperature on the basis of the detection temperature of each profile temperature sensor and a weighting factor calculated from the correlation; and controlling the each heater so that the virtual temperature is coincident with the target temperature.

Furthermore, in order to attain the above object, according to a second aspect of the present invention, a method of obtaining a temperature correction value in which a target temperature is given in a thermal treatment furnace and a correction value for making the temperature in a thermal treatment area of the thermal treatment furnace coincident with the target temperature is obtained comprises: determining the correlation of a heater and plural profile temperature sensors provided in the thermal treatment furnace; calculating a virtual temperature on the basis of the detection temperature of each profile temperature sensor and a weighting factor calculated from the correlation concerned; and making the virtual temperature coincident with the target temperature and obtaining as the correction value the difference between the target temperature and the detection temperature of an in-furnace temperature sensor provided out of the thermal treatment area of the thermal treatment furnace when the virtual temperature is coincident with the target temperature.

Still furthermore, in order to attain the above object, according to a third aspect of the present invention, a method of manufacturing a semiconductor device in which a target temperature is given in a thermal treatment furnace and plural heaters are controlled according to the target temperature to manufacture a semiconductor device comprises: determining the correlation of the each heater and plural profile temperature sensors provided in the thermal treatment furnace; calculating a virtual temperature on the basis of the detection temperature of each profile temperature sensor and a weighting factor calculated from the correlation concerned; and controlling the each heater so that the virtual temperature is coincident with the target temperature, thereby manufacturing the semiconductor device.

Still furthermore, in order to attain the above object, according to a fourth aspect of the present invention, a substrate treatment apparatus in which a target temperature is given in a thermal treatment furnace and plural heaters are controlled according to the target temperature to treat a substrate comprises: a temperature controller for determining the correlation of the each heater and plural profile temperature sensors provided in the thermal treatment furnace and calculating a virtual temperature on the basis of the detection temperature of each profile temperature sensor and a weighting factor calculated from the correlation concerned; and a power supply unit for controlling the each heater so that the virtual temperature is coincident with the target temperature.

In order to attain the above object, according to a fifth aspect of the present invention, a temperature control method in which a target temperature is given in a thermal treatment furnace and plural heaters are controlled according to the target temperature comprises: calculating a virtual temperature on the basis of the detection temperature of a profile temperature sensor provided in a thermal treatment area of the thermal treatment furnace; and controlling the each heater so that the virtual temperature is coincident with the target temperature.

In order to attain the above object, according to a sixth aspect of the present invention, a temperature control method in which a target temperature having a temperature gradient is given in a thermal treatment furnace and plural heaters are controlled according to the target temperature comprises: calculating a virtual temperature on the basis of the detection temperature of a profile temperature sensor provided in a thermal treatment area of the thermal treatment furnace; and controlling the each heater so that the virtual temperature is coincident with a virtual target temperature based on the target temperature.

In the temperature control method described above, the virtual temperature is determined at each of plural predetermined positions, a temperature detected at each of plural detection positions of the profile temperature sensor is multiplied by a weighting factor which increases as the detection position of the profile temperature sensor approaches to the predetermined position, thereby obtaining an integration value, and the sum of the integration values is set as the virtual temperature.

Furthermore, in the temperature control method described above, the virtual temperature is determined at each of plural predetermined positions, temperature are detected at detection positions out of plural predetermined positions of the profile temperature sensor, the detection positions being located within a predetermined range from the predetermined position, and the average temperature of the detected temperatures is set as the virtual temperature.

In the temperature control method described above, the virtual target temperature is determined at each of plural predetermined positions, and the average temperature of the target temperatures within a predetermined range from the predetermined position is set as the virtual target temperature.

In the temperature control method described above, the virtual target temperature is determined at each of plural predetermined positions, target temperatures are set at plural set positions, the target temperature set at each set position is multiplied by a weighting factor which increases as the set position approaches to the predetermined position, thereby obtaining an integration value, and the sum of the integration values is set as the virtual target temperature.

In order to attain the above object, according to a seventh aspect of the present invention, a thermal treatment apparatus in which a target temperature is given in a thermal treatment furnace and plural heaters are adjusted according to the target temperature comprises: a calculator for calculating a virtual temperature on the basis of the detection temperature of a profile temperature provided in a thermal treatment area of the thermal treatment furnace; and a first controller for controlling the each heater so that the virtual temperature is coincident with the target temperature.

In order to attain the above object, according to an eighth aspect of the present invention, a thermal treatment apparatus in which a target temperature having a temperature gradient is given in a thermal treatment furnace and plural heaters are adjusted according to the target temperature comprises: a calculator for calculating a virtual temperature on the basis of the detection temperature of a profile temperature provided in a thermal treatment area of the thermal treatment furnace; and a second controller for controlling the each heater so that the virtual temperature is coincident with a virtual target temperature based on the target temperature.

In order to attain the above object, according to a ninth aspect of the present invention, a method of manufacturing a semiconductor device in which a target temperature is given in a thermal treatment furnace and plural heaters are controlled according to the target temperature to manufacture a semiconductor device comprises: calculating a virtual temperature on the basis of the detection temperature of a profile temperature sensor provided in a thermal treatment area of the thermal treatment furnace; and controlling the each heater so that the virtual temperature is coincident with the target temperature.

In order to attain the above object, according to a tenth aspect of the present invention, a method of manufacturing a semiconductor device in which a target temperature having a temperature gradient is given in a thermal treatment furnace and plural heaters are controlled according to the target temperature comprises: calculating a virtual temperature on the basis of the detection temperature of a profile temperature sensor provided in a thermal treatment area of the thermal treatment furnace; and controlling the each heater so that the virtual temperature is coincident with a virtual target temperature based on the target temperature.

In order to attain the above object, according to an eleventh aspect of the present invention, a method of obtaining a temperature correction value in which a target temperature is given in a thermal treatment furnace and a correction value for making the temperature in a thermal treatment area of the thermal treatment furnace is coincident with the target temperature is obtained comprises: calculating a virtual temperature on the basis of the detection temperature of a profile temperature sensor provided in the thermal treatment area, making the virtual temperature coincident with the target temperature and obtaining as the correction value the difference between the detection temperature of an in-furnace temperature sensor provided out of the thermal treatment area of the thermal treatment furnace and the target temperature when the virtual temperature is coincident with the target temperature.

In order to attain the above object, according to a twelfth aspect of the present invention, a method of obtaining a temperature correction value in which a target temperature having a temperature gradient is given in a thermal treatment furnace and a correction value for making the temperature in a thermal treatment area of the thermal treatment furnace is coincident with the target temperature is obtained comprises: calculating a virtual temperature on the basis of the detection temperature of a profile temperature sensor provided in the thermal treatment area, making the virtual temperature coincident with a virtual target temperature based on the target temperature and obtaining as the correction value the difference between the detection temperature of an in-furnace temperature sensor provided out of the thermal treatment area of the thermal treatment furnace and the target temperature when the virtual temperature is coincident with the target temperature.

In order to attain the above object, according to a thirteenth aspect of the present invention, a power control method for a treatment apparatus having a thermal treatment furnace containing a thermal treatment area segmentalized into plural zones and equipped with heaters which are individually provided every zone and temperature sensors whose number exceeds the number of the heaters, power to be supplied to the heaters in the treatment apparatus being controlled comprises: multiplying a weighting factor increasing as the position of the temperature sensor approaches to the neighborhood of a predetermined position of the zone and a variation amount of the temperature detected by the temperature sensor corresponding to the weighting factor; calculating a virtual temperature by summing up the integration values every zone; determining a matrix containing weighting factors as elements every temperature sensor and every zone and multiplying the matrix concerned by a matrix containing as elements factors each of which represents the rate of a variation amount of a power supply amount to the heater and a variation amount of the detection temperature of the temperature sensor and determined every temperature sensor and every zone, thereby calculating a thermal interference matrix; creating a relational expression between the variation amount of the virtual temperature and the variation amount of the power supply amount on the basis of the thermal interference matrix; calculating a variation amount of the power supply amount of each zone on the basis of the variation amount of the virtual temperature based on the calculated virtual temperature of each zone and the relational expression; and supplying power to the each heater on the basis of the variation amount of the power supply amount so that the virtual temperature is equal to a target temperature.

According to this invention, in the temperature control for the treatment apparatus in which the thermal treatment area is divided into plural zones which is provided with heaters for individually the respective zones, the detection units whose number exceed the division number are provided, and the detection temperature detected from the detection unit is effectively used, whereby at least the temperature of the thermal treatment area can be made coincident with the target temperature.

DETAILED DESCRIPTION OF THE PREFERRED EMBODIMENTS

Preferred embodiments according to the present invention will be described hereunder with reference to the accompanying drawings.

(First Embodiment)

Figure 1:
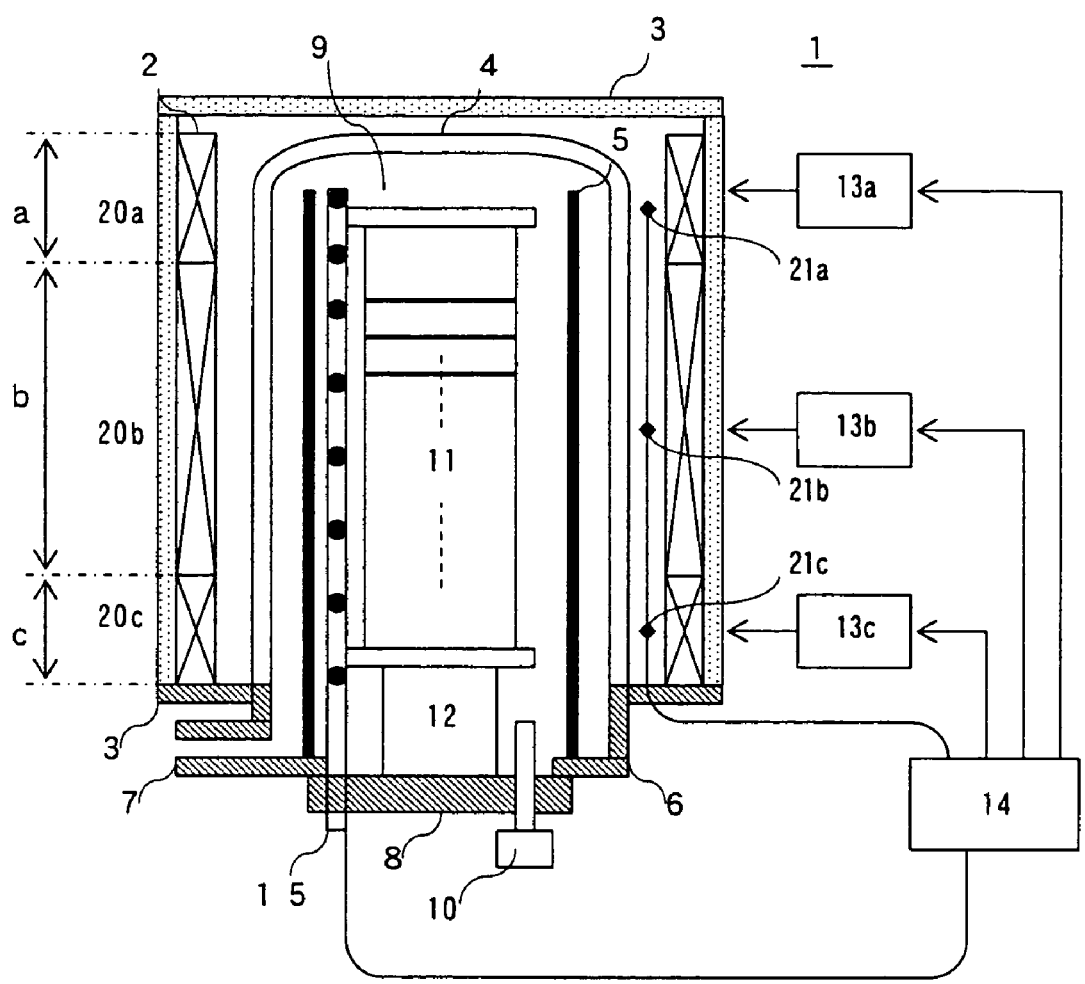
FIG. 1 is a diagram showing a vertical type thermal treatment furnace when a profile temperature sensor according to an embodiment of the present invention is provided.

In a first embodiment, a virtual temperature based on detection temperatures of profile temperature sensors 15 shown in FIG. 1 is controlled to be coincident with a target temperature. The virtual temperature in the first embodiment is determined in connection with each of plural in-furnace temperature sensors 21. Proper detection temperatures are selected from detection temperatures of many profile temperature sensors 15 and averaged to obtain the average temperature as the virtual temperature. The in-furnace temperature sensor 21 is provided every zone, and thus the virtual temperature may be determined in connection with each zone.

Figure 2:
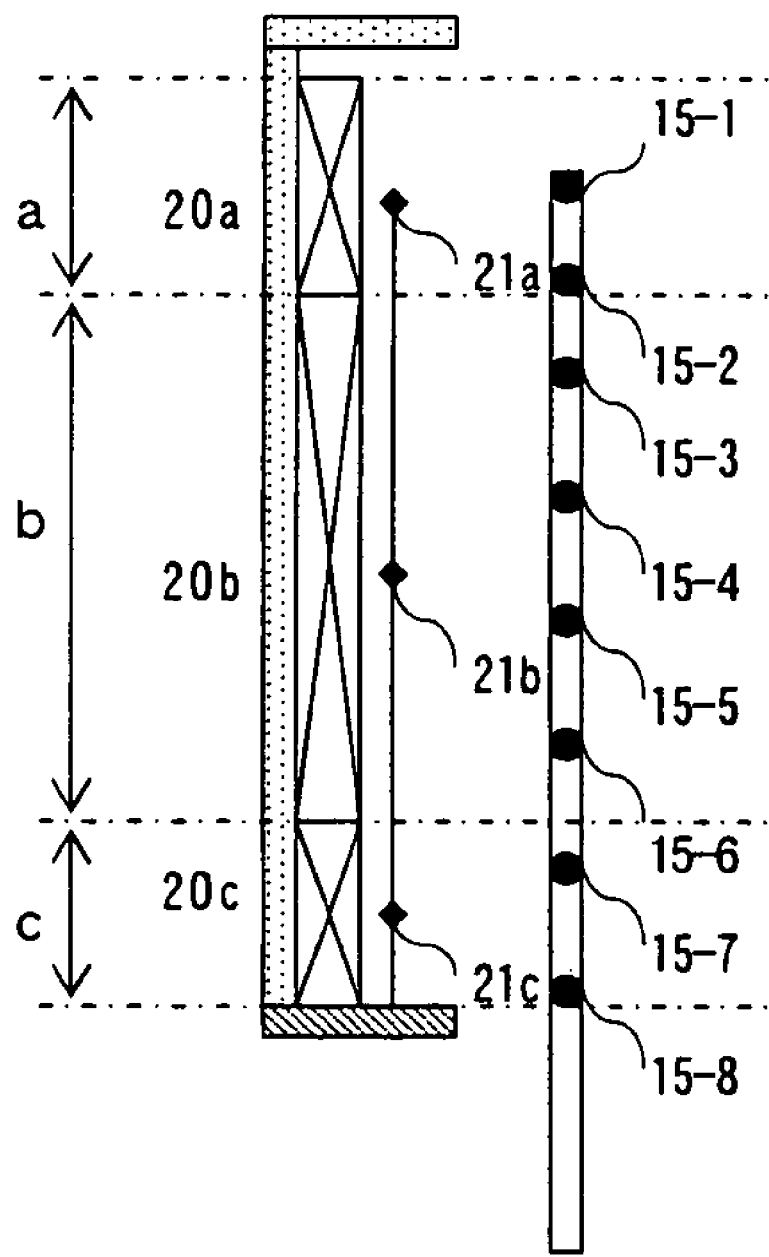
FIG. 2 is a diagram showing the positional relationship of the profile temperature sensor, an in-furnace temperature sensor and a heater according to the embodiment of the present invention.

The virtual temperature will be described in more detail with reference to FIG. 2.

For example, the virtual temperatures are set as follows. With respect to the in-furnace temperature sensor 21a, an average temperature of profile temperatures sensors 15-1 and 15-2 contained in the a zone area corresponding to the in-furnace temperature sensor 21a is set as the virtual temperature. With respect to the in-furnace temperature sensor 21b, an average temperature of profile temperature sensors 15-3 to 15-6 contained in the b zone area corresponding to the in-furnace temperature 21b is set at the virtual temperature. With respect to the in-furnace temperature sensor 21c, an average temperature of profile temperature sensors 15-7, 15-8 contained in the c zone area corresponding to the in-furnace temperature 21c is set as the virtual temperature.

In the first embodiment, an estimation equation representing the sum of squares of the difference between the target temperature and each detection temperature is introduced as an estimation criterion for estimating how the detection temperature of the profile temperature sensor 15 is close to the target temperature. For example, when the sum of squares of the difference between the target temperature and each detection temperature in the a zone, an estimation equation Ja is given by the following equation (1) when Y represents the target temperature:

$$J_a = \sum_{i=1}^{2} (Y - P_i)^2 \tag{1}$$

Here, assuming that the detection temperatures P1, P2 of the profile temperature sensors 15-1, 15-2 are given, it is considered what values P1, P2 minimize Ja. Ja increases like a quadratic function as the difference between the target temperature Y and each detection temperature is larger, and it varies so as to describe a downwardly-convex parabola with respect to the variation of the target temperature Y. Therefore, the condition under which Ja is minimized is determined by partially differentiating Ja with respect to Y and setting the partial differential result to zero.

$$J_a = \sum_{i=1}^{2} (Y - P_i)^2$$

$$\frac{\partial J_a}{\partial Y} = \frac{\partial}{\partial Y}\left[\sum_{i=1}^{2} (Y - P_i)^2\right]$$

$$= \sum_{i=1}^{2} 2(Y - P_i)$$

$$= 2\sum_{i=1}^{2} Y - 2\sum_{i=1}^{2} P_i$$

Here, by setting $\partial J_a/\partial Y=0$, the equation (2) is obtained.

$$\sum_{i=1}^{2} Y = \sum_{i=1}^{2} P_i \tag{2}$$

$$Y = \frac{1}{2}\sum_{i=1}^{2} P_i$$

The equation (2) indicates that when the detection temperatures P1, P2 of the profile temperature sensors 15-1, are given, Ja obtains the minimum value when the average value of the detection temperatures P1, P2 is coincident with the target temperature Y. Conversely, if the average value of the detection temperatures of the profile temperature sensors 15-1, 15-2 is set to the virtual temperature and the each heater is controlled so that the virtual temperature is coincident with the target temperature Y, Ja is consequently equal to the minimum value.

The same is applied to the b zone and the c zone. That is, the temperature control is carried out so that the average value of the detection temperatures of the profile temperature sensors 15 targeted in each zone is set as the virtual temperature and also the virtual temperature concerned is coincident with the target temperature Y, whereby the estimation of the sum of squares of the difference between the target temperature and each detection temperature is controlled to be minimum as a result with respect to each zone. The control method of the heaters 2 on the basis of the virtual temperature will be described with respect to a third embodiment.

By making the profile temperature sensor 15 correspond to each zone, the estimation of the sum of squares of the difference between the target temperature and each detection temperature is controlled to be minimum as a whole.

(Second Embodiment)

In the first embodiment, the detection temperature of the profile temperature sensor 15 contained in each zone area is set to the virtual temperature corresponding to each in-furnace temperature sensor 21. However, it may be modified so that some profile temperature sensors 15 located in a range which affects each in-furnace temperature sensor 21 are selected and the average temperature of the detection temperatures of the selected profile temperature sensors 15 is set as the virtual temperature.

For example, the virtual temperature corresponding to the in-furnace temperature sensor 21a may be set to the average temperature of the detection temperatures of the profile temperature sensors 15-1 to 15-4 which are expected to be affected by the heater 20a, the virtual temperature corresponding to the in-furnace temperature sensor 21b may be set to the average temperature of the detection temperatures of the profile temperature sensors 15-2 to 15-7 which are expected to be affected by the heater 20b, and also the virtual temperature corresponding to the in-furnace temperature sensor 21c may be set to the average temperature of the detection temperatures of the profile temperature sensors 15-6 to 15-8 which are expected to be affected by the heater 20c. In this case, even when there are duplicative profile temperature sensors, the estimation of the sum of squares of the difference between the target temperature and each detection temperature can be controlled to be minimized as a whole by selecting all the profile temperature sensors 15 without any missing sensor.

However, if the virtual temperature is set to the average value of the detection temperatures of all the profile temperature sensors 15 by expanding the above idea, it would be clear that the control cannot be performed well. This is because all the virtual temperatures corresponding to the in-furnace temperature sensors 21 indicate the same average value. In this case, the heaters 20a, 20b, 20c as heating units are adjusted to control the same temperature. That is, the significance that the heater 2 is divided into the three parts 20a, 20b, 20c for the purpose of the high-precision control is lost. Therefore, in the second embodiment, the selection of the profile temperature sensors 15 targeted to calculate the virtual temperature must be performed properly. The guide for the proper selection and the control method of the heaters 2 on the basis of the virtual temperature will be described with reference to a third embodiment.

(Third Embodiment)

With respect to the virtual temperature in the third embodiment, the virtual temperature is determined in connection with each of plural in-furnace temperature sensors 21, and each value of detection temperatures of the profile temperature sensors 15 is multiplied by a predetermined weighting factor corresponding to each detection temperature (for example, the weighting factors of the profile temperature sensors 15-1, 15-2 located in the neighborhood of the in-furnace temperature sensor 21a are set to large numerical values, and the numerical value allocated to the weighting factor is reduced as the profile temperature sensor is far away from the in-furnace temperature sensor 21a as in the case of the profile temperature sensors 15-7, 15-8, etc.), and the sum of the integration values of the detection temperatures and the weighting factors is set as the virtual temperature.

The virtual temperature of the third embodiment will be described in more detail. In FIG. 2, when the detection temperatures of the profile temperature sensors 15 are represented by P1 to P8, the virtual temperature Va corresponding to the in-furnace temperature sensor 21a is determined from the following equation (3).

$$V_a = \alpha_{a,1} \cdot P_1 + \alpha_{a,2} \cdot P_2 + \alpha_{a,3} \cdot P_3 + \alpha_{a,4} \cdot P_4 + \alpha_{a,5} \cdot P_5 + \alpha_{a,6} \cdot P_6 + \alpha_{a,7} \cdot P_7 + \alpha_{a,8} \cdot P_8 \quad (3)$$

Here, $\alpha_{a,1}$ to $\alpha_{a,8}$ represent weighting factors which are predetermined and stored in the temperature controller 14 in advance, and the sum of these values is equal to 1 (that is, $\alpha_{a,1} + \alpha_{a,2} + \ldots + \alpha_{a,8} = 1$). The weighting factors $\alpha_{a,1}$ to $\alpha_{a,8}$ are read out before the temperature control, and used. The virtual temperatures Vb, Vc corresponding to the in-furnace temperatures 21b, 21c are also determined in the same manner.

It is necessary to control the heater 2 so that the above virtual temperature is coincident with the target temperature.

Next, the relationship between the variation amount of the virtual temperature and the variation amount of the control amount (power supply amount) of the heater 2 will be described.

First, it is assumed that a thermal interference matrix (correlation) from the variation of the power supply amount to the heater 2 to the variation of the detection temperature of the profile temperature sensor 15 is obtained. With respect to the interference matrix, in the Japanese Patent No. 3,834,216, the degree of the variation amount of plural output values to the variation amount of plural input values is generally converted to a numerical value and represented by a matrix. In this application, the interference matrix is defined as the relationship of the variation amounts of the detection temperatures of both the in-furnace temperature sensor 21 and the profile temperature sensor 15. In the third embodiment, the interference matrix from the variation of the power supply amount to the heater 2 to the variation of the detection temperature of the profile temperature sensor 15 is obtained. From the viewpoint of the interference matrix from power to temperature, it is clarified by using the term "thermal interference matrix" in order to discriminate it from the interference matrix from temperature to temperature in the above related technique.

The thermal interference matrix is obtained as follows. First, the power supply amount to the heater 2 is settled so that the detection temperatures of the profile temperature sensors 15 approach to the target temperature, and the power supply amount concerned is fixed and supplied to the heater 2 until the detection temperatures of all the profile temperature sensors 15 are stabilized. Subsequently, after all the zones are stable, the power supply amount to the heater 20a in one zone (for example, the a zone) is added with several W (Watts) or several percentages (a rate to the maximum value of the power supply amount). Thereafter, when a sufficient time elapses and the temperature is stable, the variation amount of the detection temperature of each profile temperature sensor 15 is recorded.

From this result, when the variation amount of the power supply amount to the heater 20a is represented by ΔHa and the variation amounts of the detection temperatures of the respective profile temperature sensors 15 are represented by ΔP1 to ΔP8, the following equation is obtained.

$$\Delta P_1 = \beta_{1,a} \cdot \Delta H_a$$

$$\Delta P_2 = \beta_{2,a} \cdot \Delta H_a$$

$$M$$

$$\Delta P_8 = \beta_{8,a} \cdot \Delta H_a$$

Here, each of $\beta_{1,a}$ to $\beta_{8,a}$ represents a factor representing the degree (rate) of the variation of the detection temperature of each profile temperature sensor 15 with respect to the variation of the power supply amount to the a zone. Similar factors can be obtained for the b zone and the c zone by executing the same operation. That is, representing the variation amount of the power supply amount to the heater 20b by ΔHb, the following equation is obtained:

$$\Delta P_1 = \beta_{1,b} \cdot \Delta H_b$$

$$\Delta P_2 = \beta_{2,b} \cdot \Delta H_b$$

$$\Delta P_8 = \beta_{8,b} \cdot \Delta H_b$$

Furthermore, representing the variation amount of the power supply amount to the heater 20c by ΔHc, the following equation is obtained:

$$\Delta P_1 = \beta_{1,c} \cdot \Delta H_c$$

$$\Delta P_2 = \beta_{2,c} \cdot \Delta H_c$$

$$M$$

$$\Delta P_8 = \beta_{8,c} \cdot \Delta H_c$$

Here, by collecting these results, the variation amounts of the detection temperatures of the profile temperature sensors 15 are represented by the following equation:

$$\Delta P_1 = \beta_{1,a} \cdot \Delta H_a + \beta_{1,b} \cdot \Delta H_b + \beta_{1,c} \cdot \Delta H_c$$

$$\Delta P_2 = \beta_{2,a} \cdot \Delta H_a + \beta_{2,b} \cdot \Delta H_b + \beta_{2,c} \cdot \Delta H_c$$

$$M$$

$$\Delta P_8 = \beta_{8,a} \cdot \Delta H_a + \beta_{8,b} \cdot \Delta H_b + \beta_{8,c} \cdot \Delta H_c$$

That is, the variation amount of the detection temperature of each profile temperature sensor 15 can be represented by the sum of constant multiplications of the variation amounts of the power supply amount to the respective heaters 2. When this relational expression is represented by using a matrix, the following equation (4) is obtained.

$$\begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix} = \begin{bmatrix} \beta_{1,a} & \beta_{1,b} & \beta_{1,c} \\ \beta_{2,a} & \beta_{2,b} & \beta_{2,c} \\ \beta_{3,a} & \beta_{3,b} & \beta_{3,c} \\ \beta_{4,a} & \beta_{4,b} & \beta_{4,c} \\ \beta_{5,a} & \beta_{5,b} & \beta_{5,c} \\ \beta_{6,a} & \beta_{6,b} & \beta_{6,c} \\ \beta_{7,a} & \beta_{7,b} & \beta_{7,c} \\ \beta_{8,a} & \beta_{8,b} & \beta_{8,c} \end{bmatrix} \cdot \begin{bmatrix} \Delta H_a \\ \Delta H_b \\ \Delta H_c \end{bmatrix} \quad (4)$$

$$\begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix} = M_\beta \cdot \begin{bmatrix} \Delta H_a \\ \Delta H_b \\ \Delta H_c \end{bmatrix}$$

In the equation (4), the first term of the right-hand side is represented by the thermal interference matrix Mβ.

Next, with respect to the virtual temperature, the equation (3) is re-represented as the variation amount as in the case of the equation (4). It is assumed that the virtual temperature Va in the equation (3) is varied to Va+ΔVa when the detection temperatures P1 to P8 of the profile temperature sensors 15 are varied to P1+ΔP1 to P8+ΔP8. At this time, from the equation (3), the following equation is obtained:

$$V_a + \Delta V_a = \alpha_{a,1} \cdot (P_1 + \Delta P_1) + \alpha_{a,2} \cdot (P_2 + \Delta P_2) + \alpha_{a,3} \cdot (P_3 + \Delta P_3) + \alpha_{a,4} \cdot (P_4 + \Delta P_4) + \alpha_{a,5} \cdot (P_5 + \Delta P_5) + \alpha_{a,6} \cdot (P_6 + \Delta P_6) + \alpha_{a,7} \cdot (P_7 + \Delta P_7) + \alpha_{a,8} \cdot (P_8 + \Delta P_8)$$

Accordingly, $$V_a + \Delta V_a = (\alpha_{a,1} \cdot P_1 + \alpha_{a,2} \cdot P_2 + \alpha_{a,3} \cdot P_3 + \alpha_{a,4} \cdot P_4 +$$
$$\alpha_{a,5} \cdot P_5 + \alpha_{a,6} \cdot P_6 + \alpha_{a,7} \cdot P_7 + \alpha_{a,8} \cdot P_8) +$$
$$(\alpha_{a,1} \cdot \Delta P_1 + \alpha_{a,2} \cdot \Delta P_2 + \alpha_{a,3} \cdot \Delta P_3 + \alpha_{a,4} \cdot \Delta P_4 +$$
$$\alpha_{a,5} \cdot \Delta P_5 + \alpha_{a,6} \cdot \Delta P_6 + \alpha_{a,7} \cdot \Delta P_7 + \alpha_{a,8} \cdot \Delta P_8)$$
$$= V_a + (\alpha_{a,1} \cdot \Delta P_1 + \alpha_{a,2} \cdot \Delta P_2 + \alpha_{a,3} \cdot \Delta P_3 + \alpha_{a,4} \cdot \Delta P_4 +$$
$$\alpha_{a,5} \cdot \Delta P_5 + \alpha_{a,6} \cdot \Delta P_6 + \alpha_{a,7} \cdot \Delta P_7 + \alpha_{a,8} \cdot \Delta P_8)$$

Therefore, the following equation is satisfied for the variation amount ΔVa of the virtual temperature:

$$\Delta V_a = \alpha_{a,1} \cdot \Delta P_1 + \alpha_{a,2} \cdot \Delta P_2 + \alpha_{a,3} \cdot \Delta P_3 + \alpha_{a,4} \cdot \Delta P_4 + \alpha_{a,5} \cdot \Delta P_5 + \alpha_{a,6} \cdot \Delta P_6 + \alpha_{a,7} \cdot \Delta P_7 + \alpha_{a,8} \cdot \Delta P_8$$

Likewise, with respect to the virtual temperatures Vb, Vc, the following equations are satisfied:

$$\Delta V_b = \alpha_{b,1} \cdot \Delta P_1 + \alpha_{b,2} \cdot \Delta P_2 + \alpha_{b,3} \cdot \Delta P_3 + \alpha_{b,4} 19 \Delta P_4 + \alpha_{b,5} \cdot \Delta P_5 + \alpha_{b,6} \cdot \Delta P_6 \cdot \alpha_{b,7} \cdot \Delta P_7 + \alpha_{b,8} \cdot \Delta P_8$$

$$\Delta V_c = \alpha_{c,1} \cdot \Delta P_1 + \alpha_{c,2} \cdot \Delta P_2 + \alpha_{c,3} \cdot \Delta P_3 + \alpha_{c,4} \cdot \Delta P_4 + \alpha_{c,5} \cdot \Delta P_5 + \alpha_{c,6} \cdot P_6 + \alpha_{c,7} \cdot \Delta P_7 \cdot \alpha_{c,8} \cdot \Delta P_8$$

When these equations are represented by using a matrix, $$\begin{bmatrix} \Delta V_a \\ \Delta V_b \\ \Delta V_c \end{bmatrix} = \begin{bmatrix} \alpha_{a,1} & \alpha_{a,2} & \alpha_{a,3} & \alpha_{a,4} & \alpha_{a,5} & \alpha_{a,6} & \alpha_{a,7} & \alpha_{a,8} \\ \alpha_{b,1} & \alpha_{b,2} & \alpha_{b,3} & \alpha_{b,4} & \alpha_{b,5} & \alpha_{b,6} & \alpha_{b,7} & \alpha_{b,8} \\ \alpha_{c,1} & \alpha_{c,2} & \alpha_{c,3} & \alpha_{c,4} & \alpha_{c,5} & \alpha_{c,6} & \alpha_{c,7} & \alpha_{c,8} \end{bmatrix} \cdot \begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix} \quad (5)$$

$$\begin{bmatrix} \Delta V_a \\ \Delta V_b \\ \Delta V_c \end{bmatrix} = M_\alpha \cdot \begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix}$$

In the equation (5), the first term of the right-hand side is represented by Mα.

Next, the relationship between the variation amount of the power supply amount shown in the equation (4) and the variation amount of the virtual temperature shown in the equation (5) is considered. By substituting the equation (5) into the equation (4), $$\begin{bmatrix} \Delta V_a \\ \Delta V_b \\ \Delta V_c \end{bmatrix} = M_\alpha \cdot M_\beta \cdot \begin{bmatrix} \Delta H_a \\ \Delta H_b \\ \Delta H_c \end{bmatrix} = \quad (6)$$

-continued $$\begin{bmatrix} \alpha_{a,1} & \alpha_{a,2} & \alpha_{a,3} & \alpha_{a,4} & \alpha_{a,5} & \alpha_{a,6} & \alpha_{a,7} & \alpha_{a,8} \\ \alpha_{b,1} & \alpha_{b,2} & \alpha_{b,3} & \alpha_{b,4} & \alpha_{b,5} & \alpha_{b,6} & \alpha_{b,7} & \alpha_{b,8} \\ \alpha_{c,1} & \alpha_{c,2} & \alpha_{c,3} & \alpha_{c,4} & \alpha_{c,5} & \alpha_{c,6} & \alpha_{c,7} & \alpha_{c,8} \end{bmatrix} \cdot \begin{bmatrix} \beta_{1,a} & \beta_{1,b} & \beta_{1,c} \\ \beta_{2,a} & \beta_{2,b} & \beta_{2,c} \\ \beta_{3,a} & \beta_{3,b} & \beta_{3,c} \\ \beta_{4,a} & \beta_{4,b} & \beta_{4,c} \\ \beta_{5,a} & \beta_{5,b} & \beta_{5,c} \\ \beta_{6,a} & \beta_{6,b} & \beta_{6,c} \\ \beta_{7,a} & \beta_{7,b} & \beta_{7,c} \\ \beta_{8,a} & \beta_{8,b} & \beta_{8,c} \end{bmatrix} \cdot \begin{bmatrix} \Delta H_a \\ \Delta H_b \\ \Delta H_c \end{bmatrix}$$

$$\therefore \begin{bmatrix} \Delta V_a \\ \Delta V_b \\ \Delta V_c \end{bmatrix} = \begin{bmatrix} \sum_{i=1}^{8} \alpha_{a,i}\beta_{i,a} & \sum_{i=1}^{8} \alpha_{a,i}\beta_{i,b} & \sum_{i=1}^{8} \alpha_{a,i}\beta_{i,c} \\ \sum_{i=1}^{8} \alpha_{b,i}\beta_{i,a} & \sum_{i=1}^{8} \alpha_{b,i}\beta_{i,b} & \sum_{i=1}^{8} \alpha_{b,i}\beta_{i,c} \\ \sum_{i=1}^{8} \alpha_{c,i}\beta_{i,a} & \sum_{i=1}^{8} \alpha_{c,i}\beta_{i,b} & \sum_{i=1}^{8} \alpha_{c,i}\beta_{i,c} \end{bmatrix} \cdot \begin{bmatrix} \Delta H_a \\ \Delta H_b \\ \Delta H_c \end{bmatrix}$$

Here, the first term of the right-hand side of the equation (6) represents the thermal interference matrix from the power supply amount to the heater 2 to the virtual temperature. Each element of the thermal interference matrix represents the sum of multiplications of the respective elements of the thermal interference matrix Mβ obtained in the equation (4) and the weighting factors given to define the virtual temperature in the equation (5). Accordingly, the characteristic indicated by the thermal interference matrix (the thermal interference matrix indicated by the equation (6)) from the power supply amount to the heater 2 to the virtual temperature can be favorably changed by properly setting the weighting factors of the equation (5).

PID control calculation is frequently used as the control algorithm contained in the temperature controller 14. When a generally well-known PID control calculation method is applied to a case where the virtual temperature Va corresponding to the in-furnace temperature sensor 21a is controlled as the target temperature Y in FIG. 1, the following equation (Kp, Ki, Kd represent coefficients) is obtained.

$$H_a = Kp \cdot (Y - V_a) + Ki \cdot \int (Y - V_a)dt + Kd \cdot \frac{d}{dt}(Y - V_a) \quad (7)$$

In the equation (7), only the value of the virtual temperature Va for the corresponding a zone is used to determine the power supply amount Ha to the heater 20a. The general PID control calculation which is broadly used has one feature that it is based on one-input one-output control (one temperature is used to determine one power supply amount) as described above.

Next, it will be considered by using an example what style the thermal interference matrix shown in the equation (6) should require from the viewpoint of easiness and appropriateness of the temperature control. There is considered a case where the control is performed so that the virtual temperatures Va, Vb, Vc determined in the equation (5) are coincident with the target temperature in place of the in-furnace temperature sensors 21a, 21b, 21c in each case, and the control algorithm thereof is a general PID control calculation (equation 7).

As a result of the calculation of the thermal interference matrix shown in the equation (6), a diagonal matrix is obtained, and the diagonal elements of the matrix are γa, γb, γc, the following equation is obtained.

$$\begin{bmatrix} \Delta V_a \\ \Delta V_b \\ \Delta V_c \end{bmatrix} = \begin{bmatrix} \gamma_a & 0 & 0 \\ 0 & \gamma_b & 0 \\ 0 & 0 & \gamma_c \end{bmatrix} \cdot \begin{bmatrix} \Delta H_a \\ \Delta H_b \\ \Delta H_c \end{bmatrix} = \begin{bmatrix} \gamma_a \cdot \Delta H_a \\ \gamma_b \cdot \Delta H_b \\ \gamma_c \cdot \Delta H_c \end{bmatrix}$$

In this case, the power supplied to the respective heaters 20a, 20b, 20c affect only the virtual temperatures in the corresponding zones, respectively. Specifically, describing this with respect to the a zone, only the power supply amount Ha to the heater 20a affects the virtual temperature Va. Accordingly, the significance that the heater 2 is divided into the three parts is not lost, and also even when the PID control calculation as the one-input one-output control is used, the control can be performed with high precision if the control parameters are proper.

Next, as a calculation result of the thermal interference matrix shown in the equation (6), when the diagonal elements are γa, γb, γc and the other elements are equal to a smaller value ε than the diagonal elements, the following equation is obtained.

$$\begin{bmatrix} \Delta V_a \\ \Delta V_b \\ \Delta V_c \end{bmatrix} = \begin{bmatrix} \gamma_a & \varepsilon & \varepsilon \\ \varepsilon & \gamma_b & \varepsilon \\ \varepsilon & \varepsilon & \gamma_c \end{bmatrix} \cdot \begin{bmatrix} \Delta H_a \\ \Delta H_b \\ \Delta H_c \end{bmatrix} = \begin{bmatrix} \gamma_a \cdot \Delta H_a + \varepsilon \cdot (\Delta H_b + \Delta H_c) \\ \gamma_b \cdot \Delta H_b + \varepsilon \cdot (\Delta H_a + \Delta H_c) \\ \gamma_c \cdot \Delta H_c + \varepsilon \cdot (\Delta H_a + \Delta H_b) \end{bmatrix}$$

In this case, the power supplied to the respective heaters 20a, 20b, 20c affect the respective virtual temperatures of the corresponding zones respectively, however, it also affects the other zones to no small extent. Specifically describing this with respect to the a zone, the power supply amount Ha to the heater 20a relatively strongly affect the virtual temperature Va, and relatively weakly affects the virtual temperatures Vb, Vc. Accordingly, the heater 20a as a unit for controlling the virtual temperature Va is effective, and thus the significance that the heater 2 is divided into plural parts is not lost. Furthermore, from another viewpoint, when the PID control calculation as the one-input one-output control is used, only the method of adjusting the power supply amount Ha can be used as the unit for performing the temperature control of the virtual temperature Va, and thus the effect from the power supply amount Hb or Hc is an effect of obstructing the control of the virtual temperature Va, so-called external disturbance. However, if ε is relatively sufficiently smaller than γa, the external disturbance is small and thus the control can be performed if the control parameters are properly adjusted.

Next, there is considered a case where the first to third columns of the thermal interference matrix shown in the equation (6) are equal to γa, γb, γc, respectively.

$$\begin{bmatrix} \Delta V_a \\ \Delta V_b \\ \Delta V_c \end{bmatrix} = \begin{bmatrix} \gamma_a & \gamma_b & \gamma_c \\ \gamma_a & \gamma_b & \gamma_c \\ \gamma_a & \gamma_b & \gamma_c \end{bmatrix} \cdot \begin{bmatrix} \Delta H_a \\ \Delta H_b \\ \Delta H_c \end{bmatrix} = \begin{bmatrix} \gamma_a \cdot \Delta H_a + \gamma_b \cdot \Delta H_b + \gamma_c \cdot \Delta H_c \\ \gamma_a \cdot \Delta H_a + \gamma_b \cdot \Delta H_b + \gamma_c \cdot \Delta H_c \\ \gamma_a \cdot \Delta H_a + \gamma_b \cdot \Delta H_b + \gamma_c \cdot \Delta H_c \end{bmatrix}$$

In this case, the power supplied to the respective heaters 20a, 20b, 20c also affects the other zones at the same level as the corresponding zone. Specifically describing this with respect to the a zone, the power supply amount Ha to the heater 20a affects the virtual temperatures Va, Vb, Vc at the same level. Furthermore, the characteristic thereof is identical in the b zone and the c zone. Therefore, it is not proper that the heater 20$a$ is used as the unit for controlling the virtual temperature Va, and the significance that the heater 2 is divided into three parts is lost. On the other hand, paying attention to the appropriateness, when the PID control calculation as the one-input one-output control is used, if the value of γa is larger than the values of γb and γc, the control of the virtual temperature Va can be smoothly performed because the external disturbance is small. However, with respect to the control of the virtual temperature Vb at this time, the value of γa is larger than the value of γb, the external disturbance is large. As a result, it takes much time until the virtual temperature Vb is coincident with the target temperature, or the control becomes impossible.

From the above description, it is desired to set the thermal interference matrix from the power supply amount to the heater 2 to the virtual temperature in the equation (6) so that the values of the diagonal elements of the thermal interference matrix are larger than the values of the other elements, and by setting the weighting factors of the equation (5) so as to satisfy this, the control can be performed with high precision without losing the significance that the heater 2 is divided into three parts.

Next, a guide for determining the range of the profile temperature sensors 15 which are selected for the virtual temperature of a desired zone in the second embodiment will be described.

First, the first and second embodiments are contained in the third embodiment, and thus they can be represented by the third embodiment. For example, When the method of setting the virtual temperature Va to the average temperature of the profile temperature sensors 15-1 to 15-4 which are estimated to be affected by the heater 20$a$, setting the virtual temperature Vb to the average temperature of the profile temperature sensors 15-2 to 15-7 which are estimated to be affected by the heater 20$b$ and setting the virtual temperature Vc to the average temperature of the profile temperature sensors 15-6 to 15-8 which are estimated to be affected by the heater 20$c$ is applied to the equation (5) in order to implement this method by the third embodiment, the following equation is obtained:

$$\begin{bmatrix} \Delta V_a \\ \Delta V_b \\ \Delta V_c \end{bmatrix} = \begin{bmatrix} \frac{1}{4} & \frac{1}{4} & \frac{1}{4} & \frac{1}{4} & 0 & 0 & 0 & 0 \\ 0 & \frac{1}{6} & \frac{1}{6} & \frac{1}{6} & \frac{1}{6} & \frac{1}{6} & \frac{1}{6} & 0 \\ 0 & 0 & 0 & 0 & 0 & \frac{1}{3} & \frac{1}{3} & \frac{1}{3} \end{bmatrix} \cdot \begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix}$$

That is, by setting the average coefficient (the value of 1/N if the selection number is equal to N) to the variation amount of the detection temperature of the profile temperature sensor 15 as a target, the virtual temperature in the second embodiment can be represented. Furthermore, by the same method, the virtual temperature of the first embodiment can be represented.

The weighting factors of the equation (5) may be set so that the values of the diagonal elements of the thermal interference matrix from the power supply amount to the heater 2 to the virtual temperature in the equation (6) are larger than the values of the other elements as described above.

Next, an example of the method of setting the weighting factors of the equation (5) in the second embodiment will be described by using numerical values. For example, it is assumed that the thermal interference matrix Mβ of the equation (4) is represented by the numerical values of the following equation:

$$\begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix} = \begin{bmatrix} 0.9 & 0.4 & 0.1 \\ 0.5 & 0.6 & 0.0 \\ 0.3 & 1.0 & -0.1 \\ 0.1 & 1.2 & 0.0 \\ 0.1 & 1.3 & 0.2 \\ 0.0 & 1.2 & 0.5 \\ -0.1 & 0.6 & 0.7 \\ 0.0 & 0.2 & 0.9 \end{bmatrix} \cdot \begin{bmatrix} \Delta H_a \\ \Delta H_b \\ \Delta H_c \end{bmatrix}$$

In order to make the values of the diagonal elements of the thermal interference matrix of the equation (6) larger than the values of the other elements, the profile temperature sensors whose numerical values are not less than 0.5 are selected as the reference for the selection. Specifically, with respect to the virtual temperature Va, the profile temperature sensors 15-1 and 15-2 (0.9 on first line and first column and 0.5 on second line and first column)are selected. With respect to the virtual temperature Vb, the profile temperature sensors 15-2 to 15-7 (0.6 on second line and second column to 0.6 on second line and seventh column) are selected. With respect to the virtual temperature Vc, the profile temperature sensors 15-6 to 15-8 (0.5 on third line and sixth column to 0.9 on third line and eighth column) are selected. In this case, the thermal interference matrix of the equation (6) is transformed to the following equation:

$$\begin{bmatrix} \Delta V_a \\ \Delta V_b \\ \Delta V_c \end{bmatrix} = \begin{bmatrix} \frac{1}{2} & \frac{1}{2} & 0 & 0 & 0 & 0 & 0 & 0 \\ 0 & \frac{1}{6} & \frac{1}{6} & \frac{1}{6} & \frac{1}{6} & \frac{1}{6} & \frac{1}{6} & 0 \\ 0 & 0 & 0 & 0 & 0 & \frac{1}{3} & \frac{1}{3} & \frac{1}{3} \end{bmatrix} \cdot \begin{bmatrix} 0.9 & 0.4 & 0.1 \\ 0.5 & 0.6 & 0.0 \\ 0.3 & 1.0 & -0.1 \\ 0.1 & 1.2 & 0.0 \\ 0.1 & 1.3 & 0.2 \\ 0.0 & 1.2 & 0.5 \\ -0.1 & 0.6 & 0.7 \\ 0.0 & 0.2 & 0.9 \end{bmatrix} \cdot \begin{bmatrix} \Delta H_a \\ \Delta H_b \\ \Delta H_c \end{bmatrix} =$$

$$\begin{bmatrix} 0.7 & 0.5 & 0.05 \\ 0.15 & 0.98 & 0.22 \\ -0.03 & 0.67 & 0.7 \end{bmatrix} \cdot \begin{bmatrix} \Delta H_a \\ \Delta H_b \\ \Delta H_c \end{bmatrix}$$

In this case, the first line and second column (0.5) and the third line and second column (0.67) of the thermal interference matrix are slightly large, and thus the numerical value as the selection reference is changed to 0.6 or more. The calculation is carried out in the same manner, and the following equation is obtained:

$$\begin{bmatrix} \Delta V_a \\ \Delta V_b \\ \Delta V_c \end{bmatrix} = \begin{bmatrix} 1 & 0 & 0 & 0 & 0 & 0 & 0 & 0 \\ 0 & \frac{1}{6} & \frac{1}{6} & \frac{1}{6} & \frac{1}{6} & \frac{1}{6} & \frac{1}{6} & 0 \\ 0 & 0 & 0 & 0 & 0 & 0 & \frac{1}{2} & \frac{1}{2} \end{bmatrix} \cdot$$

$$\begin{bmatrix} 0.9 & 0.4 & 0.1 \\ 0.5 & 0.6 & 0.0 \\ 0.3 & 1.0 & -0.1 \\ 0.1 & 1.2 & 0.0 \\ 0.1 & 1.3 & 0.2 \\ 0.0 & 1.2 & 0.5 \\ -0.1 & 0.6 & 0.7 \\ 0.0 & 0.2 & 0.9 \end{bmatrix} \cdot \begin{bmatrix} \Delta H_a \\ \Delta H_b \\ \Delta H_c \end{bmatrix} = \begin{bmatrix} 0.9 & 0.4 & 0.1 \\ 0.15 & 0.98 & 0.22 \\ -0.05 & 0.4 & 0.8 \end{bmatrix} \cdot \begin{bmatrix} \Delta H_a \\ \Delta H_b \\ \Delta H_c \end{bmatrix}$$

Accordingly, the values of the diagonal elements are larger than the values of the other elements. Accordingly, in this example, the object of the present invention can be attained by selecting the profile temperature sensor 15-1 for the virtual temperature Va, the profile temperature sensors 15-2 to 15-7 for the virtual temperature Vb and the profile temperature sensors 15-7 to 15-8 for the virtual temperature Vc.

Next, it will be described how the weighting factors in the third embodiment should be set.

First, it is assumed that the in-furnace temperature sensor 21 is controlled so that the detection temperature thereof is coincident with the target temperature Y and stabilized because sufficient time elapses. The detection temperatures of the profile temperature sensors 15 at this time are represented by P1 to P8 and the power supply amounts to the respective heaters 2 are represented by Ha, Hb, Hc. The errors of the detection temperatures P1 to P8 of the profile temperature sensors 15 with respect to the target temperature Y (the values obtained by subtracting the detection temperatures from the target temperature) are represented by a vector Po. According to the Japanese Patent No. 3,834,216, the variation amounts of the power supply amounts to the heaters 2 which are required to make the detection temperatures of the profile temperature sensors 15 approach to the target temperature Y are given as follows.

$$\begin{bmatrix} \Delta H_a \\ \Delta H_b \\ \Delta H_c \end{bmatrix} = [M_\beta^T \cdot M_\beta]^{-1} \cdot M_\beta^T \cdot P_0 \tag{8}$$

From the above patent, the correction is made so that the positive and negative signs of the errors Po are reversed.

Next, as a result of the sufficient time lapse on the same assumption, it is assumed that the virtual temperatures of the third embodiment are set to Va, Vb, Vc. For the virtual temperatures, the equation (9) is satisfied.

$$\begin{bmatrix} \Delta V_a \\ \Delta V_b \\ \Delta V_c \end{bmatrix} = M_\alpha \cdot \begin{bmatrix} P_1 \\ P_2 \\ P_3 \\ P_4 \\ P_5 \\ P_6 \\ P_7 \\ P_8 \end{bmatrix} \tag{9}$$

Thereafter, it is assumed that the virtual temperatures are controlled so as to be coincident with the target temperature Y and sufficient time elapses, so that the virtual temperatures are set to Va+Δa, Vb+Δb, Vc+Δc.

$$\begin{bmatrix} Y \\ Y \\ Y \end{bmatrix} = \begin{bmatrix} V_a + \Delta V_a \\ V_b + \Delta V_b \\ V_c + \Delta V_c \end{bmatrix}$$

Here, the relationship between the errors Po and the variation amounts Δa, Δb, Δc of the virtual temperatures will be considered. When the detection temperatures P1 to P8 of the profile file temperature sensors 15 vary by only the errors Po and the detection temperatures of all the profile temperature sensors 15 are coincident with the target temperature Y, all the virtual temperatures are coincident with the target temperature Y (because the sum of the weighting factors on each line of Mα is equal to 1) from the equation (9). Accordingly, the following equation is obtained:

$$M_\alpha \cdot \begin{bmatrix} P_1 \\ P_2 \\ P_3 \\ P_4 \\ P_5 \\ P_6 \\ P_7 \\ P_8 \end{bmatrix} + P_0 = \begin{bmatrix} Y \\ Y \\ Y \end{bmatrix}$$

Accordingly, the following equation (10) is satisfied for the relationship between the variation amounts Δa, Δb, Δc of the virtual temperatures and the errors Po.

$$M_\alpha \cdot P_0 = \begin{bmatrix} \Delta V_a \\ \Delta V_b \\ \Delta V_c \end{bmatrix} \tag{10}$$

Furthermore, from the equation (6), assuming that the weighting factors are set in Mα so that Mα×Mβ has an inverse matrix, the following equation is satisfied:

$$\begin{bmatrix} \Delta H_a \\ \Delta H_b \\ \Delta H_c \end{bmatrix} = [M_\alpha \cdot M_\beta]^{-1} \cdot \begin{bmatrix} \Delta V_a \\ \Delta V_b \\ \Delta V_c \end{bmatrix} \tag{11}$$

In addition to the preparation of the above equations, the following equation is introduced:

$$M_\alpha = \begin{bmatrix} \mu_a \cdot \beta_{1,a} & \mu_a \cdot \beta_{2,a} & \mu_a \cdot \beta_{3,a} & \mu_a \cdot \beta_{4,a} & \mu_a \cdot \beta_{5,a} & \mu_a \cdot \beta_{6,a} & \mu_a \cdot \beta_{7,a} & \mu_a \cdot \beta_{8,a} \\ \mu_b \cdot \beta_{1,b} & \mu_b \cdot \beta_{2,b} & \mu_b \cdot \beta_{3,b} & \mu_b \cdot \beta_{4,b} & \mu_b \cdot \beta_{5,b} & \mu_b \cdot \beta_{6,b} & \mu_b \cdot \beta_{7,b} & \mu_b \cdot \beta_{8,b} \\ \mu_c \cdot \beta_{1,c} & \mu_c \cdot \beta_{2,c} & \mu_c \cdot \beta_{3,c} & \mu_c \cdot \beta_{4,c} & \mu_c \cdot \beta_{5,c} & \mu_c \cdot \beta_{6,c} & \mu_c \cdot \beta_{7,c} & \mu_c \cdot \beta_{8,c} \end{bmatrix} \quad (12)$$

$$= \begin{bmatrix} \mu_a & 0 & 0 \\ 0 & \mu_b & 0 \\ 0 & 0 & \mu_c \end{bmatrix} \cdot \begin{bmatrix} \beta_{1,a} & \beta_{2,a} & \beta_{3,a} & \beta_{4,a} & \beta_{5,a} & \beta_{6,a} & \beta_{7,a} & \beta_{8,a} \\ \beta_{1,b} & \beta_{2,b} & \beta_{3,b} & \beta_{4,b} & \beta_{5,b} & \beta_{6,b} & \beta_{7,b} & \beta_{8,b} \\ \beta_{1,c} & \beta_{2,c} & \beta_{3,c} & \beta_{4,c} & \beta_{5,c} & \beta_{6,c} & \beta_{7,c} & \beta_{8,c} \end{bmatrix}$$

$$M_\alpha = \begin{bmatrix} \mu_a & 0 & 0 \\ 0 & \mu_b & 0 \\ 0 & 0 & \mu_c \end{bmatrix} \cdot M_\beta^T$$

Here, $\mu a$, $\mu b$, $\mu c$ represent coefficients for making the sum of each line of $M\alpha$ equal to 1, and they are given by the following equations:

$$\mu_a = \frac{1}{\sum_{i=1}^{8} \beta_{i,a}}, \quad \mu_b = \frac{1}{\sum_{i=1}^{8} \beta_{i,b}}, \quad \mu_c = \frac{1}{\sum_{i=1}^{8} \beta_{i,c}}$$

By transforming the equation (12) and substituting it into the equation (8), the following equation is obtained:

$$\begin{bmatrix} \Delta H_a \\ \Delta H_b \\ \Delta H_c \end{bmatrix} = \left[ \begin{bmatrix} \mu_a & 0 & 0 \\ 0 & \mu_b & 0 \\ 0 & 0 & \mu_c \end{bmatrix}^{-1} \cdot M_\alpha \cdot M_\beta \right]^{-1} \cdot \begin{bmatrix} \mu_a & 0 & 0 \\ 0 & \mu_b & 0 \\ 0 & 0 & \mu_c \end{bmatrix}^{-1} \cdot M_\alpha \cdot P_0$$

$$= [M_\alpha \cdot M_\beta]^{-1} \cdot \begin{bmatrix} \mu_a & 0 & 0 \\ 0 & \mu_b & 0 \\ 0 & 0 & \mu_c \end{bmatrix} \cdot \begin{bmatrix} \mu_a & 0 & 0 \\ 0 & \mu_b & 0 \\ 0 & 0 & \mu_c \end{bmatrix}^{-1} \cdot M_\alpha \cdot P_0$$

$$= [M_\alpha \cdot M_\beta]^{-1} \cdot M_\alpha \cdot P_0$$

$$= [M_\alpha \cdot M_\beta]^{-1} \cdot \begin{bmatrix} \Delta V_a \\ \Delta V_b \\ \Delta V_c \end{bmatrix}$$

This equation is coincident with the equation (11). Here, the equation (10) is used in the calculation process.

As described above, the variation amounts of the power supply amount to the heaters 2 which are required to make all the detection temperatures of the profile temperature sensors 15 approach to the target temperature Y are given according to the equation (8), and they are obtained by determining the weighting factors so as to satisfy the equation (12) in the third embodiment and obtaining the virtual temperatures.

The thermal interference matrix $M\beta$ to be used for reference to determine the weighting factors for obtaining the virtual temperatures may be estimated to some degree without obtaining any strict values. Accordingly, even when the values of $M\beta$ are not obtained in the process of implementing the present invention, the purpose of sufficiently implementing the third embodiment and the first and second embodiments using the average value of the third embodiment by using the estimated values of $M\beta$ can be attained. If the values of $M\beta$ can be obtained, they can be effectively used to implement the present invention as in the case of the equation (12).

The respective numeric values of the thermal interference matrix $M\beta$ may be prepared in advance, and the thermal interference matrix $M\beta$ may be used as the parameter when the temperature control is actually performed.

(Fourth Embodiment)

In the thermal treatment furnace 1 shown in FIG. 1, there has been recently such a case that the thermal treatment area is not subjected to temperature control so that the temperature of the whole area is set to a single target temperature, but it is subjected to temperature control while a target temperature having a temperature gradient in the long-axis direction is set. For example, the target temperatures of the a zone, the b zone and the c zone are provided with gradients to be set to Y+ΔYa, Y+ΔYb, Y+ΔYc, and as a more specific example, ΔYa is set to 1° C., ΔYb is set to 0° C. and ΔYc is set to −1° C.

The reason why the gradient is provided to the target temperature is as follows. That is, when the treatment substrate is subjected to a thermal treatment in FIG. 1, reaction gas is introduced from the gas introducing nozzle 10 and drifts upwardly through the inside of the inner tube 5. When the gas passes through the thermal treatment area 9, the gas comes into contact with the treatment substrate, and thin film is formed on the treatment substrate by the CVD reaction. At this time, the gas concentration is higher at the upstream side of the gas, and the gas concentration is lower at the downstream side of the gas, so that there occurs a difference between the thin film formed at the upper side of the thermal treatment area 9 and the thin film formed at the lower side of the thermal treatment area 9. Therefore, in order to correct this difference and obtain uniform thin film as a whole, the target temperature is provided with a gradient between the upper and lower sides of the thermal treatment area 9.

In such a case, it is impossible to apply the style that the target temperature is set to a single value as in the case of the first, second and third embodiments.

In the fourth embodiment, in FIG. 1, the control is performed so that the virtual temperature based on the detection temperatures of the profile temperature sensors 15 is coincident with a virtual target temperature based on a target temperature having a temperature gradient (hereinafter referred to as "gradient target temperature") as described above.

In the fourth embodiment, the virtual temperature is the same as described with reference to the first, second and third embodiments, and the virtual target temperature is also determined in the same manner as the calculation method of the virtual temperature.

Figure 3:
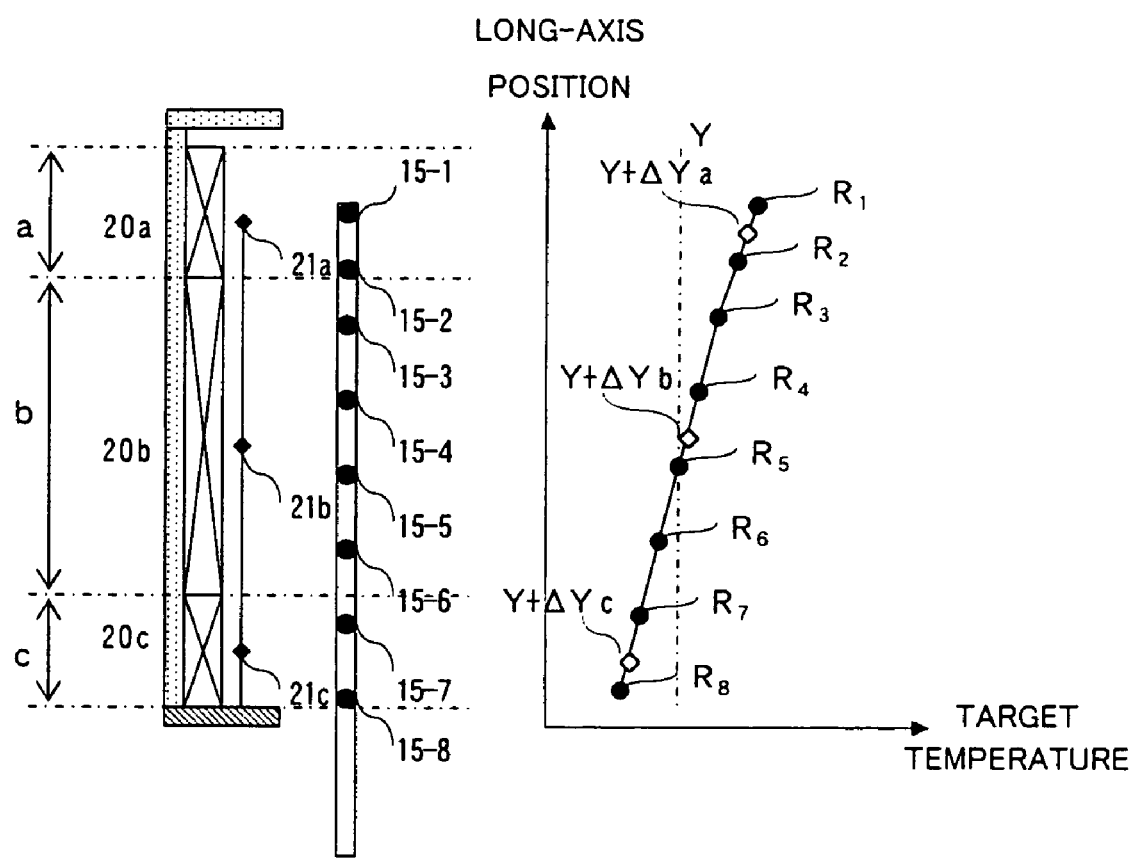
FIG. 3 is a diagram showing the relationship of the positions of the profile temperature sensor, the in-furnace temperature sensor and the heater and a target temperature having a gradient temperature according to the embodiment of the present invention.

The virtual target temperature will be described in more detail with reference to FIG. 3. FIG. 3 is a diagram showing a target temperature having a gradient temperature in addition to FIG. 2.

In FIG. 3, R1 to R8 represent gradient target temperatures to which the profile temperature sensors 15 should be controlled. Y+ΔYa, Y+ΔYb, Y+ΔYc represent gradient target temperatures corresponding to the in-furnace temperature sensors 21.

In the first embodiment, the virtual temperature corresponding to the in-furnace temperature sensor 21a is set to the average temperature of the profile temperature sensors 15-1 and 15-2, the virtual temperature corresponding to the in-furnace temperature sensor 21b is set to the average temperature of the profile temperature sensors 15-3 to 15-6, and the virtual temperature corresponding to the in-furnace temperature sensor 21c is set to the average temperature of the profile temperature sensors 15-7 and 15-8. Therefore, as in the case of the fourth embodiment, the virtual target temperature corresponding to the in-furnace temperature sensor 21a is set to the average of R1 and R2, the virtual target temperature corresponding to the in-furnace temperature sensor 21b is set to the average of R3 to R6, and the virtual target temperature corresponding to the in-furnace temperature sensor 21c is set to the average of R7 and R8.

The same may be applied to the case of the second embodiment.

Furthermore, in the third embodiment, when the virtual temperature Va is calculated by the equation (3), the virtual target temperature Wa corresponding to the in-furnace temperature sensor 21a is calculated by the following equation:

$$W_a = \alpha_{a,1} \cdot R_1 + \alpha a,2 \cdot R_2 + \alpha_{a,3} \cdot R_3 + \alpha_{a,4} \cdot R_4 + \alpha_{a,5} \cdot R_5 + \alpha_{a,6} \cdot R_6 + \alpha_{a,7} \cdot R_7 + \alpha_{a,8} \cdot R_8$$

The virtual target temperatures Wb, Wc corresponding to the in-furnace temperature sensors 21b, 21c can be likewise calculated.

As described above, the virtual target temperature is calculated from the gradient target temperature, and the heaters 2 are controlled so that the virtual temperature is coincident with the calculated virtual target temperature, whereby this embodiment can be applied even when the gradient target temperature is used. The control method of the heaters 2 is the same as the third embodiment, and thus the description thereof is omitted.

In the related art, the correlation between the in-furnace temperature sensor 21 and the profile temperature sensors 15 or the correlation between the in-furnace temperature sensor 21 and a weber having a thermocouple is determined in advance, and the in-furnace temperature sensor 21 is controlled on the basis of the determined correlation so as to attain the target temperature. Therefore, much time is required from the time when the temperature detected by the in-furnace temperature sensor 21 is stabilized till the temperature is stabilized to the target temperature. However, in the embodiment of the present invention, the correlation between the heaters 2 and the profile temperature sensors 15 is determined, the weighting factors are determined from the determined correlation, the virtual temperatures are calculated and the virtual temperature is controlled so as to be equal to the target temperature, so that the time required to make the detected temperature stabilized to the target temperature can be shortened.

Furthermore, in the embodiment, the in-furnace temperature sensors 21 are provided in FIG. 1. However, the temperature control is carried out by using the profile temperature sensors 15, and thus the present invention is not limited to the above embodiments, and for example the in-furnace temperature sensor 21 may be omitted.

(Fifth Embodiment)

Figure 4:
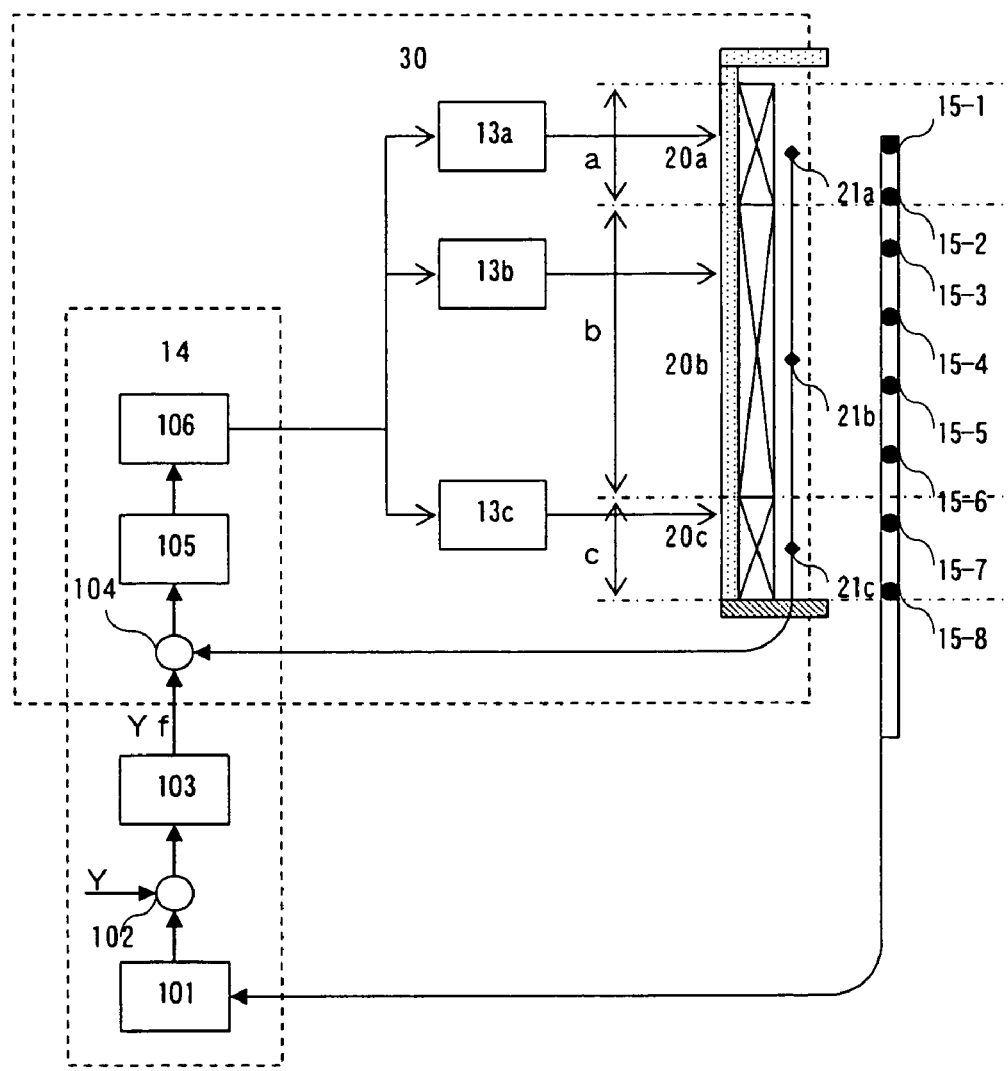
FIG. 4 is a diagram showing the functional construction in a temperature controller when cascade control according to the embodiment of the present invention is used.

When the in-furnace temperature sensor 21 and the profile temperature sensor 15 are provided in the thermal treatment area 9 of the thermal treatment furnace 1, cascade control may be used as the control algorithm executed by the temperature controller 14. FIG. 4 is a diagram showing the function construction in the temperature controller when the cascade control is used. Only one set of the elements 101 to 106 are illustrated in FIG. 4. These elements are provided to each of the a zone, the b zone and the c zone, and independently supply power to each of the heaters 20a, 20b, 20c through the power supply unit 13.

Next, each of the functions provided in the temperature controller 14 will be described. A virtual temperature converter 101 converts the detection temperatures of the profile temperature sensors 15 to the virtual temperature. A first subtracter 102 outputs the error between the virtual temperature and the target temperature Y (the value obtained by subtracting the virtual temperature from the target temperature Y). A first calculator 103 outputs Yf playing a role of the target temperature with respect to the detection temperature of the in-furnace temperature sensor 21 on the basis of the error between the virtual temperature and the target temperature Y. A second subtracter 104 outputs the error between the detection temperature of the in-furnace temperature sensor 21 and Yf (the value obtained by subtracting the detection temperature from Yf). A second subtracter 105 calculates the power supply amount on the basis of the error output from the second subtracter 104. A limiter 106 limits the value of the calculation result of the second calculator 105 to a fixed range so that the calculation result concerned is proper as a realistic power supply amount.

For example, in the a zone, an assembly which is detected, calculated or controlled in the order of the in-furnace temperature sensor 21a, the second subtracter 104, the second subtracter 105, the limiter 106, the power supply unit 13a and the heater 20a is broadly defined as a heater 30a. Likewise, the assemblies corresponding to the b zone and the c zone are defined as broadly-defined heaters 30b, 30c (when generically named, they are called as broadly-defined heater 30). Accordingly, with respect to the a zone, the broadly-defined heater 30a may be considered as a heating assembly which receives the output Yf(° C.) of the first calculator 103 corresponding to the target temperature for the in-furnace temperature sensor 21a and controls the temperature of the in-furnace temperature sensor 21a by heating according to the value of the output Yf(° C.).

Accordingly, in the temperature controller 14, when the cascade control as shown in FIG. 4 is used, the present invention can be applied by replacing the power or the power supply amount in the first to fourth embodiments by the temperature of the in-furnace temperature sensor 21.

Specifically, the variation amount of the power supply amount of the equation (4) is replaced by the variation amount of the detection temperature of the in-furnace temperature sensor 21, and in connection with this replacement, the matrix Mβ of the equation (4) is replaced by the matrix which is obtained by converting the rate of the variation amount of the detection temperature of the in-furnace temperature sensor 21 and the variation amount of the detection temperature of the profile temperature sensor 15 to numerical values. Furthermore, the thermal interference matrix of the equation (6) is replaced by the interference matrix which is obtained by converting the rate of the variation amount of the detection temperature of the in-furnace temperature sensor 21 and the variation amount of the virtual temperature to numerical values.

(Sixth Embodiment)

In the thermal treatment furnace 1, a temperature detecting unit for detecting the temperature of the heating member of the heater 2 or a quasi temperature to the temperature concerned may be provided in place of the detection of the temperature in the furnace by the in-furnace temperature sensor 21.

In this case, the same description as the first to fifth embodiments can be made in the style that the in-furnace temperature sensor 21 is replaced by the temperature detecting unit described above, however, the repetitive description is omitted.

(Seventh Embodiment)

If the profile temperature sensors 15 can be set at all times in the actual thermal treatment, the temperature can be controlled with high precision. However, there is a case where the profile temperature sensors 15 are not disposed in the actual thermal treatment process because the gap between the boat 11 and the inner tube 5 is narrow and thus the profile temperature sensors 15 may come into contact with these elements with a high risk and also the maintenance which is carried out at a fixed period is cumbersome.

When the profile temperature sensors 15 are not disposed in the thermal treatment process for the above reason, the profile temperature sensors 15 are temporarily disposed to obtain the correction value of the target temperature and also check the temperature distribution of the thermal treatment area as a preparation stage before the actual thermal treatment is carried out. When the actual thermal treatment is carried out, the thus-obtained correction value of the target temperature is used.

Figure 5:
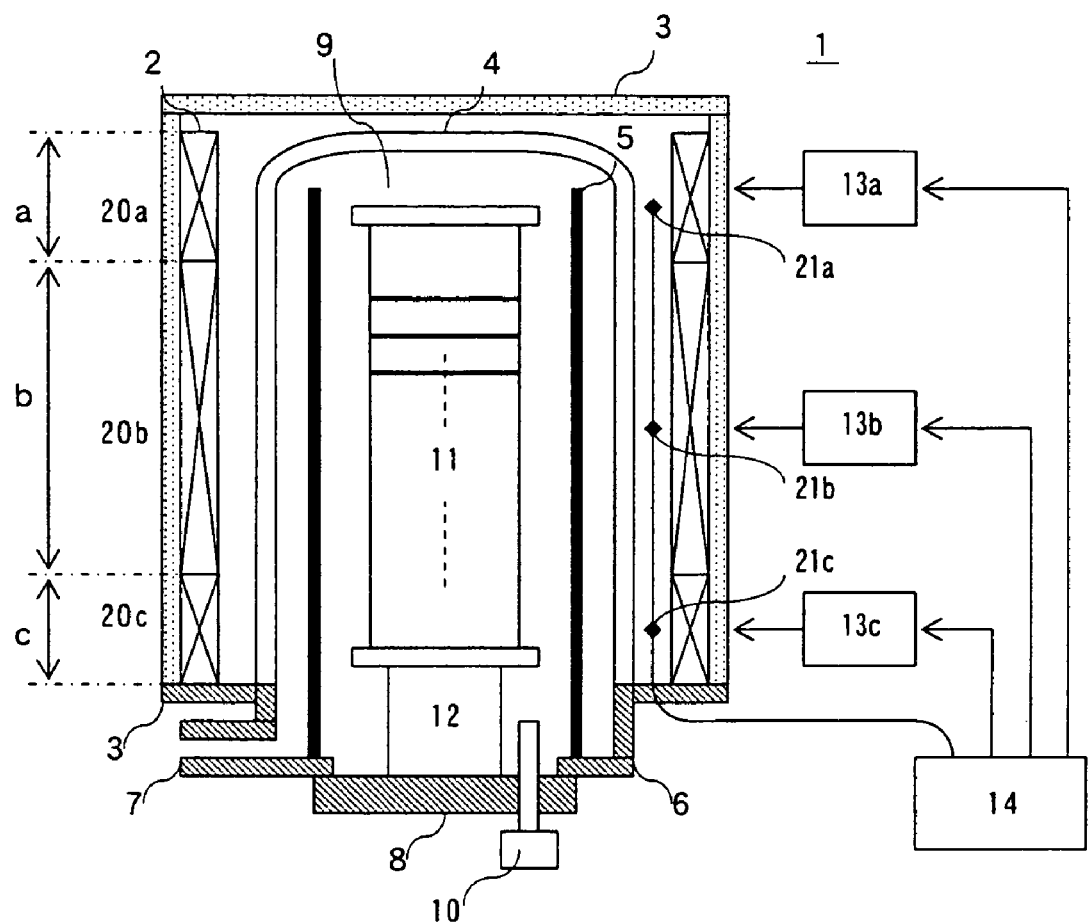
FIG. 5 is a schematic diagram showing the vertical thermal treatment furnace.
Figure 6:
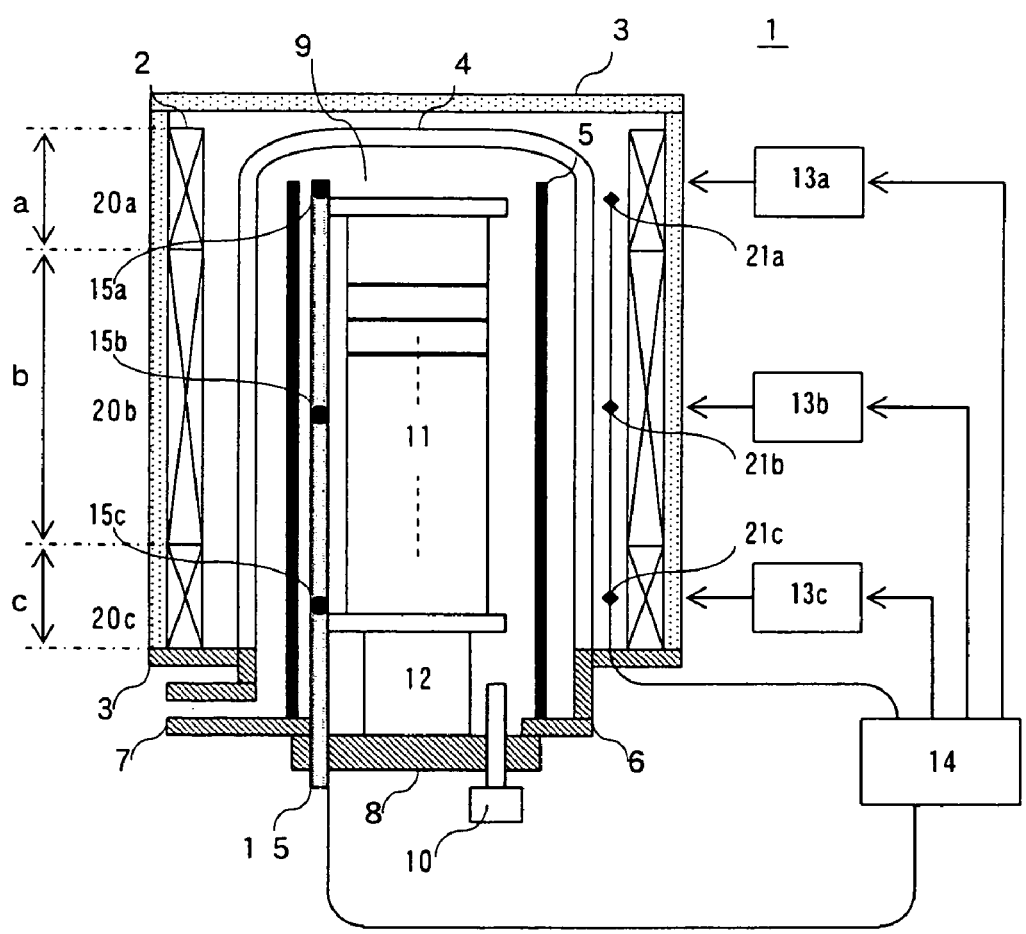
FIG. 6 is a diagram showing the vertical type thermal treatment furnace when a profile temperature sensor in a related art is added.
Figure 7:
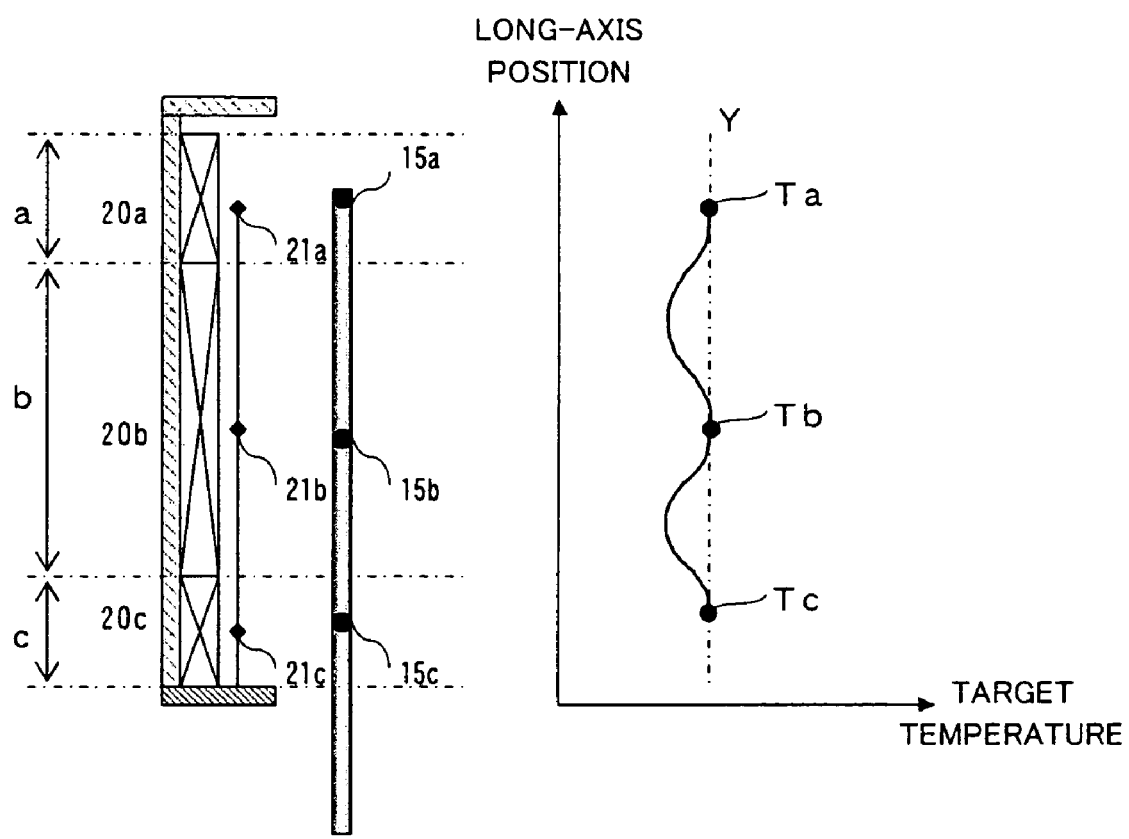
FIG. 7 is a diagram showing the relation of the positions of the profile temperature sensor, etc. and a temperature distribution in the related art.

In the Japanese Patent No. 3,834,216, in order to obtain the correction value of the target temperature, it is necessary in the pre-stage to obtain the interference matrix. In the case of the thermal treatment furnace of FIG. 5, in order to obtain interference matrix, the following procedure is required. That is, the detection temperature of the in-furnace temperature sensor 21 is first controlled and stabilized to be coincident with the target temperature (or a proximate value to the target temperature), and then the target temperature of the in-furnace temperature sensor 21a of one zone, for example of the a zone is added with several ° C. and controlled to be stabilized. Furthermore, the target temperature of the in-furnace temperature sensor 21b of another zone, for example, of the b zone is added with several ° C., and controlled to be stabilized. Still furthermore, the target temperature of the in-furnace temperature sensor 21c of the other zone, for example, of the c zone is added with several ° C. and controlled to be stabilized. In this example, the heater is divided into three parts, and thus the temperature setting and stabilization is required to be carried out at four times. However, if the heater is divided into four parts, the temperature setting and stabilization is required to be carried out at five times. If the heater is divided into five parts, the temperature setting and stabilization is required to be carried out at six times.

That is, different target temperatures must be set and stabilized at the frequency corresponding to the value obtained by adding the division number of heaters with 1. In order to stabilize the temperature, sufficient time lapse is required. Accordingly, much time is required to execute the above procedure. Therefore, there is a problem that the procedure of obtaining the interference matrix itself is cumbersome.

Therefore, skilled engineers sometimes determine correction values with try-and-error by a seat-of-the-pants approach. However, such a method requires much time for adjustment or induces dispersion in the obtained correction value.

The seventh embodiment relates to a method of obtaining the correction value of the target temperature early without relying on the seat-of-the-pants approach.

First, the method of obtaining the correction value of the target temperature in the first to third embodiments will be described.

The virtual temperature is controlled to be coincident with the target temperature (see the first to third embodiments for details), and after sufficient time elapses until the virtual temperature is stabilized, the difference between the detection temperature of the in-furnace temperature sensor 21 and the target temperature is recorded as the correction value. The details will be described with reference to FIG. 1. After sufficient time elapses until all the virtual temperatures are stabilized, the difference between the temperature of the a zone (the detection temperature of the in-furnace temperature sensor 21a) and the target temperature is recorded as the correction value of the a zone. When the target temperature is afterwards given in the actual thermal treatment, the correction of the target temperature with respect to the temperature of the a zone is carried out on the basis of the above correction value. The same is applied to the b zone and the c zone.

Next, the method of obtaining the correction value of the target temperature in the fourth embodiment will be described.

The virtual temperature is controlled to be coincident with the virtual target temperature (see the fourth embodiment for details), and after sufficient time elapses until the virtual temperature is stabilized, the difference between the detection temperature of the in-furnace temperature sensor 21 and the gradient target temperature is recorded as the correction value. Describing this in detail with reference to FIG. 3, after sufficient time elapses until all the virtual temperatures are stabilized, the difference between the temperature of the a zone (the detection temperature of the in-furnace temperature sensor 21a) and the corresponding gradient target temperature Y+ΔYa is recorded as the correction value of the a zone. When the gradient target temperature is afterwards given in the actual thermal treatment, the correction of the target temperature with respect to the temperature of the a zone is carried out on the basis of the above correction value. The same is applied to the b zone and the c zone.

Furthermore, the difference between the virtual temperature of the a zone and the target temperature Y may be recorded as the correction value of the a zone. In this case, the correction from the target temperature Y to Y+ΔYa for the recorded correction value is considered in the actual thermal treatment which will be afterwards executed.

The embodiments relate to the semiconductor manufacturing apparatus, however, they may be applied to an apparatus of processing a glass board such as an LCD device or the like, for example.

What is claimed is:

1. A temperature control method in which a target temperature is given in a thermal treatment furnace and plural heaters are controlled according to the target temperature, the method comprising:

determining a thermal interference matrix which shows a correlation of a power supply amount to the heaters and detection temperature of plural profile temperature sensors provided in the thermal treatment furnace;

calculating a virtual temperature on the basis of the detection temperature of the profile temperature sensors and a weighting factor calculated from the thermal interference matrix; and controlling the heaters so that the virtual temperature is coincident with the target temperature, wherein the weighting factor increases as a detection position of a profile temperature sensor approaches a predetermined position.

2. The temperature control method according to claim 1, wherein the virtual temperature is an average value of the detection temperature of some profile temperature sensors selected from the plural profile temperature sensors.

3. The temperature control method according to claim 2, wherein the virtual temperature is an average value of the detection temperature of plural profile temperature sensors facing heaters that are divided to plural zones.

4. The temperature control method according to claim 1, wherein the virtual temperature is obtained by multiplying the detection temperature of plural profile temperature sensors and preset weighting factors and summing the thus-obtained integration values.

5. The temperature control method according to claim 4, wherein the weighting factors are set so that a matrix calculated by multiplication with the correlation comprises a diagonal matrix.

6. The temperature control method according to claim 4, wherein the weighting factors are freely set by a worker.

7. The temperature control method according to claim 1, wherein the plural profile temperature sensors comprise sensors at a plurality of detection points, and a number of the plurality of detection points exceeds a division number of the heaters, and
wherein the plurality of detection points are arranged so as to cover an area where a treatment substrate is located in the thermal treatment furnace.

8. The temperature control method according to claim 1, wherein the target temperature comprises a temperature gradient.

9. The temperature control method according to claim 1, wherein the detection position is located within a predetermined range of distances from the predetermined position.

10. A temperature correction value obtaining method in which a target temperature is given in a thermal treatment furnace and a correction value for making the temperature in a thermal treatment area of the thermal treatment furnace coincident with the target temperature is obtained, the method comprising:
determining a thermal interference matrix which shows the correlation of a heater and plural profile temperature sensors provided in the thermal treatment furnace;
calculating a virtual temperature on the basis of the detection temperature of the profile temperature sensors and a weighting factor calculated from the thermal interference matrix concerned; and
making the virtual temperature coincident with the target temperature and obtaining as the correction value a difference between the target temperature and the detection temperature of an in-furnace temperature sensor provided out of the thermal treatment area of the thermal treatment furnace when the virtual temperature is coincident with the target temperature,
wherein the weighting factor increases as a detection position of a profile temperature sensor approaches a predetermined position.

11. A semiconductor manufacturing method in which a target temperature is given in a thermal treatment furnace and plural heaters are controlled according to the target temperature to manufacture a semiconductor device, the method comprising:
determining a thermal interference matrix which shows the correlation of a power supply amount to the heaters and detection temperature of plural profile temperature sensors provided in the thermal treatment furnace;
calculating a virtual temperature on the basis of the detection temperature of each profile temperature sensor and a weighting factor calculated from the thermal interference matrix concerned; and
controlling the heaters so that the virtual temperature is coincident with the target temperature, thereby manufacturing the semiconductor device,
wherein the weighting factor increases as a detection position of a profile temperature sensor approaches a predetermined position.

12. A substrate treatment apparatus in which a target temperature is given in a thermal treatment furnace and plural heaters are controlled according to the target temperature to treat a substrate, said substrate treatment apparatus comprising:
a controller for determining a thermal interference matrix which shows the correlation of a power supply amount to the heaters and plural profile temperature sensors provided in the thermal treatment furnace and calculating a virtual temperature on the basis of the detection temperature of the profile temperature sensors and a weighting factor calculated from the thermal interference matrix concerned; and
a power supply unit for controlling the heaters so that the virtual temperature is coincident with the target temperature,
wherein the weighting factor increases as a detection position of a profile temperature sensor approaches a predetermined position.

13. The board treatment apparatus according to claim 12, wherein the controller executes a control algorithm in the determining of the thermal interference matrix, the control algorithm comprising a cascade control algorithm.

14. The board treatment apparatus according to claim 12, wherein the controller comprises a calculator for calculating the virtual temperature on the basis of the detection temperature of a profile temperature provided in a thermal treatment area of the thermal treatment furnace.

* * * * *